(12) United States Patent
Jang et al.

(10) Patent No.: US 8,253,680 B2
(45) Date of Patent: Aug. 28, 2012

(54) SHIFT REGISTER

(75) Inventors: Yong Ho Jang, Goyang-si (KR); Binn Kim, Seoul (KR); Soo Young Yoon, Goyang-si (KR)

(73) Assignee: LG Display Co., Ltd., Seoul (KR)

(\*) Notice: Subject to any disclaimer, the term of this patent is extended or adjusted under 35 U.S.C. 154(b) by 710 days.

(21) Appl. No.: 12/336,949

(22) Filed: Dec. 17, 2008

(65) Prior Publication Data

US 2009/0256794 A1 Oct. 15, 2009

(30) Foreign Application Priority Data

Apr. 15, 2008 (KR) .............................. 10-2008-34612

(51) Int. Cl.
*G09G 3/36* (2006.01)
(52) U.S. Cl. .......................................... 345/100; 345/76
(58) Field of Classification Search ................... 345/100
See application file for complete search history.

(56) References Cited

U.S. PATENT DOCUMENTS

| 2005/0162354 A1* | 7/2005 | Osame et al. ................... 345/76 |
| 2007/0146289 A1* | 6/2007 | Lee et al. ...................... 345/100 |
| 2009/0167668 A1* | 7/2009 | Kim ............................. 345/100 |

\* cited by examiner

*Primary Examiner* — Van Chow
(74) *Attorney, Agent, or Firm* — Brinks Hofer Gilson & Lione

(57) ABSTRACT

A shift register includes a plurality of stages for sequentially outputting scan pulses to drive a plurality of gate lines, wherein each of the stages includes a set node, a pull-up switching device for outputting a corresponding scan pulse according to a logic state of the set node, at least two reset nodes, at least two pull-down switching devices, each of the pull-down switching devices being connected to a corresponding reset node to output an off voltage according to a voltage level of the corresponding reset node, and a node controller for controlling logic states of the nodes of a corresponding stage and logic states of the nodes of stages different from the corresponding stage together, wherein the node controllers of the stages control an output order of the scan pulses from the stages according to a forward voltage and reverse voltage having opposite phases.

7 Claims, 7 Drawing Sheets

SHIFT REGISTER

RELATED APPLICATIONS

This application claims the benefit of Korean Patent Application No. 10-2008-34612, filed on Apr. 15, 2008, which is hereby incorporated by reference as if fully set forth herein.

BACKGROUND

1. Field of the Disclosure

The present invention relates to a shift register, and more particularly, to a shift register which is capable of changing the output order of stages.

2. Discussion of the Related Art

In general, a liquid crystal display device is adapted to display an image by adjusting light transmittance of a liquid crystal using an electric field. To this end, the liquid crystal display device includes a liquid crystal panel having pixel areas arranged in matrix form, and a driving circuit for driving the liquid crystal panel.

In the liquid crystal panel, a plurality of gate lines and a plurality of data lines are arranged to intersect each other, and pixel areas are respectively located in areas defined by the intersections of the gate lines and the data lines. A pixel electrode and a common electrode for application of an electric field to each of the pixel areas are formed in the liquid crystal panel.

Each pixel electrode is connected to corresponding data lines via the source terminal and drain terminal of a thin film transistor (TFT), which is a switching device. The TFT is turned on by a scan pulse applied to the gate terminal thereof via corresponding lines to charge a data signal from the corresponding data line in the pixel electrode.

The driving circuit includes a gate driver for driving the gate lines, a data driver for driving the data lines, a timing controller for supplying control signals for control of the gate driver and data driver, and a power supply for supplying various driving voltages to be used in the liquid crystal display device.

The gate driver sequentially supplies scan pulses to the gate lines to sequentially drive liquid crystal cells in the liquid crystal panel on a line-by-line basis. Here, the gate driver comprises a shift register to sequentially output the scan pulses as mentioned above.

A conventional shift register includes a plurality of stages for outputting the scan pulses in order. The stages output the scan pulses in one direction, namely, in order from a top stage to a bottom stage. That is, the conventional shift register outputs the scan pulses in only one direction. For this reason, the conventional shift register involves too many problems to be used in liquid crystal display devices of various models.

BRIEF SUMMARY

A shift register includes a plurality of stages for sequentially outputting scan pulses to drive a plurality of gate lines, wherein each of the stages includes: a set node; a pull-up switching device for outputting a corresponding one of the scan pulses according to a logic state of the set node; at least two reset nodes; at least two pull-down switching devices, each of the pull-down switching devices being connected to a corresponding one of the reset nodes to output an off voltage according to a voltage level of the corresponding reset node; and a node controller for controlling logic states of the nodes of a corresponding one of the stages and logic states of the nodes of stages different from the corresponding stage together, wherein the node controllers of the stages control an output order of the scan pulses from the stages according to a forward voltage and reverse voltage having opposite phases.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
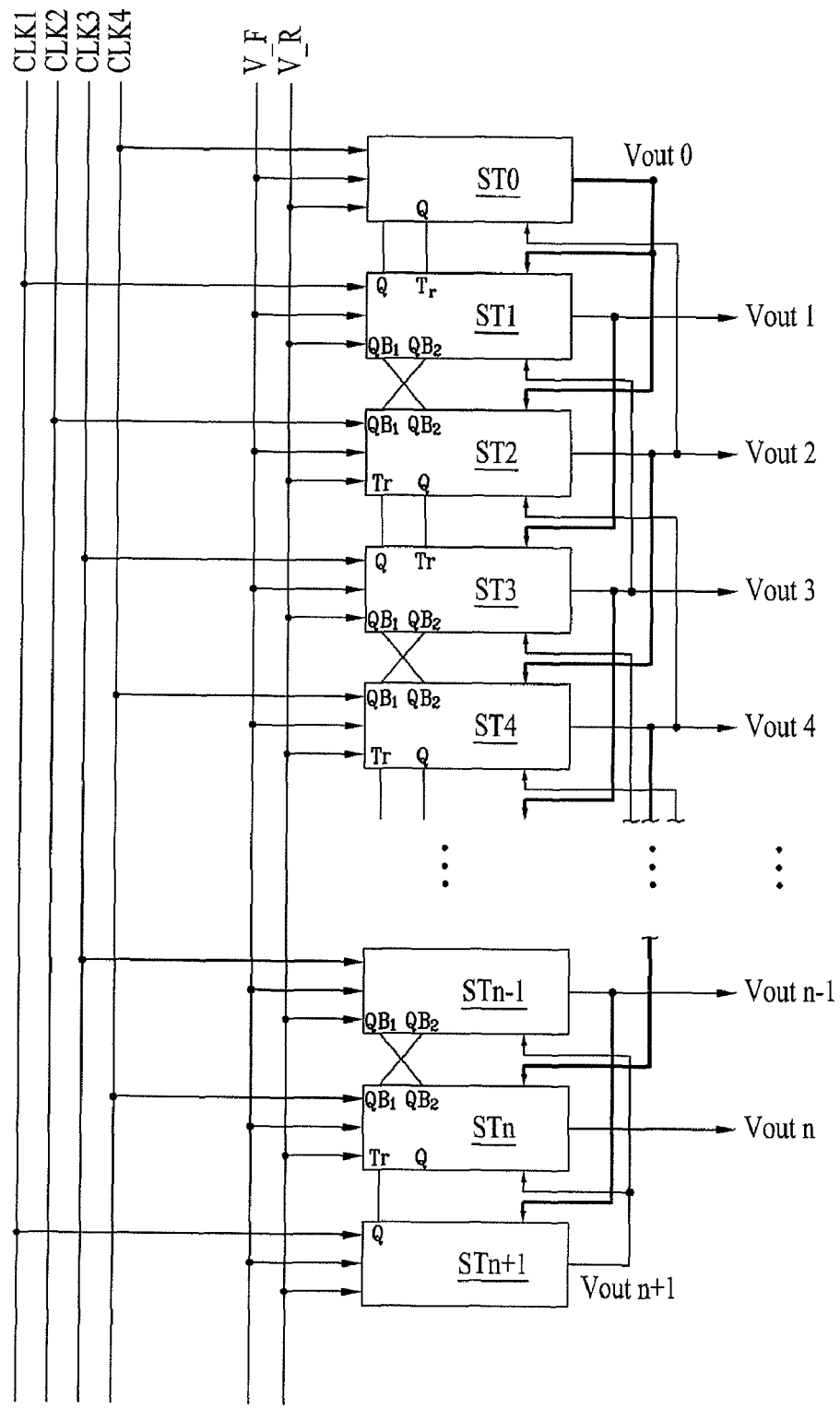
FIG. 1 is a block diagram showing the configuration of a shift register according to an embodiment of the present invention.
Figure 2:
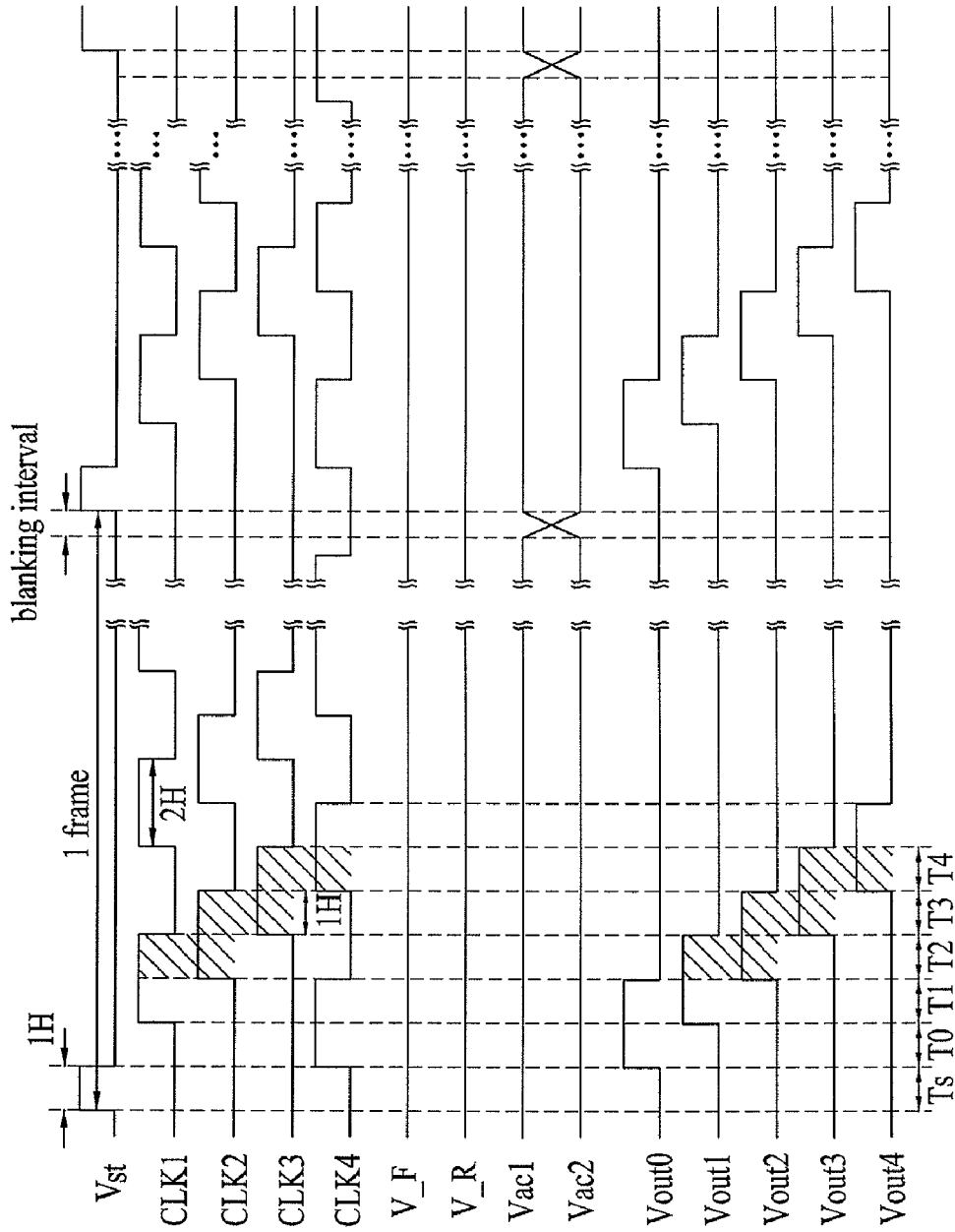
FIG. 2 is a timing diagram of various signals which are supplied to the shift register of FIG. 1 in forward driving.
Figure 3:
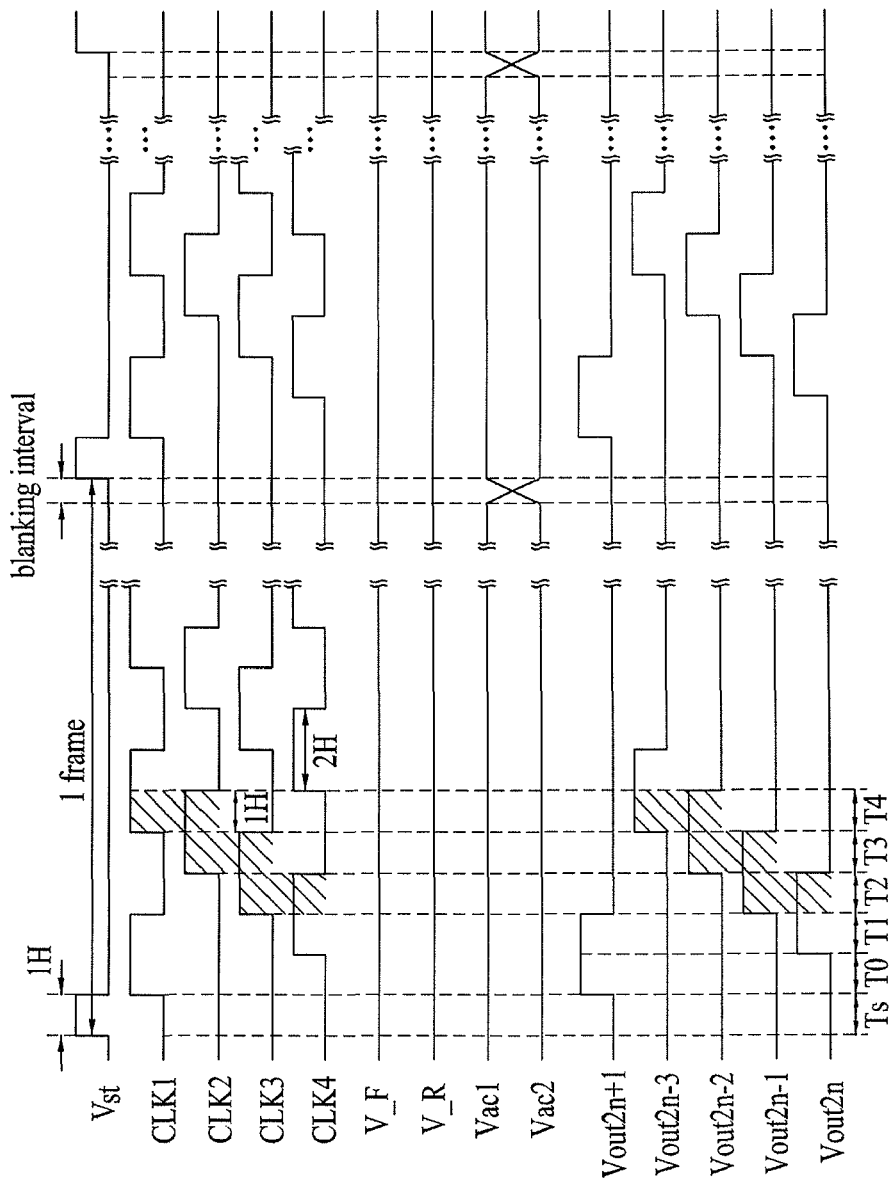
FIG. 3 is a timing diagram of various signals which are supplied to the shift register of FIG. 1 in reverse driving.

FIG. 1 is a block diagram showing the configuration of a shift register according to an embodiment of the present invention, FIG. 2 is a timing diagram of various signals which are supplied to the shift register of FIG. 1 in forward driving, and FIG. 3 is a timing diagram of various signals which are supplied to the shift register of FIG. 1 in reverse driving.

The shift register according to the present embodiment comprises n stages ST1 to STn and two dummy stages ST0 and STn+1, as shown in FIG. 1. Each of the stages ST1 to STn outputs one scan pulse for one frame period.

Each of the stages ST1 to STn drives a gate line connected thereto using the scan pulse and controls the operations of a stage downstream therefrom and a stage upstream therefrom using the scan pulse.

All the stages ST0 to STn+1 including the upper dummy stage ST0 and lower dummy stage STn+1 output scan pulses Vout0 to Voutn+1 in order.

At this time, each of the stages ST0 to STn+1 is forwardly driven or reversely driven depending on signal states of a forward voltage V_F and a reverse voltage V_R.

First, in the forward driving, the stages ST0 to STn+1 output the scan pulses in order from the upper dummy stage ST0 to the lower dummy stage STn+1.

That is, the upper dummy stage ST0 outputs a first dummy scan pulse Vout0, the first stage ST1 then outputs a first scan pulse Vout1, the second stage ST2 then outputs a second scan pulse Vout2, the third stage ST3 then outputs a third scan pulse Vout3, . . . , the nth stage STn then outputs an nth scan pulse Voutn, and the lower dummy stage STn+1 finally outputs a second dummy scan pulse Voutn+1.

On the other hand, in the reverse driving, the stages ST0 to STn+1 output the scan pulses in order from the lower dummy stage STn+1 to the upper dummy stage ST0.

That is, the lower dummy stage STn+1 outputs the second dummy scan pulse Voutn+1, the nth stage STn then outputs the nth scan pulse Voutn, the (n−1)th stage STn−1 then outputs an (n−1)th scan pulse Voutn−1, the (n−2)th stage then outputs an (n−2)th scan pulse, . . . , the first stage ST1 then outputs the first scan pulse Vout1, and the upper dummy stage ST0 finally outputs the first dummy scan pulse Vout0.

The scan pulses Vout1 to Voutn outputted from the stages ST1 to STn, other than the upper and lower dummy stages ST0 and STn+1, are sequentially supplied to gate lines of a liquid crystal panel (not shown) to sequentially scan the gate lines.

This shift register may be built in the liquid crystal panel. That is, the liquid crystal panel has a display region for displaying an image, and a non-display region surrounding the display region, and the shift register is built in the non-display region.

Each of the such configured stages ST1 to STn provided in the shift register is supplied with one of first to fourth clock pulses CLK1 to CLK4 which are outputted sequentially out of phase with one another and cyclically, a charging voltage, one of first and second alternating current (AC) voltages Vac1 and Vac2, the forward voltage V_F, and the reverse voltage V_R, as shown in FIGS. 2 and 3. At this time, odd numbered stages are supplied with the first AV voltage Vac1 and even numbered stages are supplied with the second AV voltage Vac2.

On the other hand, each of the upper and lower dummy stages ST0 and STn+1 is supplied with one of the first to fourth clock pulses CLK1 to CLK4, a start pulse Vst, the charging voltage, a discharging voltage, the forward voltage V_F, and the reverse voltage V_R.

Both the charging voltage and the discharging voltage are direct current (DC) voltages. The charging voltage is positive and the discharging voltage is negative. On the other hand, the discharging voltage may be a ground voltage.

The first and second AC voltages Vac1 and Vac2 are signals for controlling the charging and discharging of reset nodes among the nodes of each stage ST1 to STn. Both the first AC voltage Vac1 and second AC voltage Vac2 are alternating current (AC) voltages. The first AC voltage Vac1 is 180° phase-inverted with respect to the second AC voltage Vac2. The high state voltage values of the first and second AC voltages Vac1 and Vac2 may be the same as the voltage value of the charging voltage, and the low state voltage values of the first and second AC voltages Vac1 and Vac2 may be the same as the voltage value of the discharging voltage. The states of the first and second AC voltages Vac1 and Vac2 are inverted at intervals of a period of p frames. Here, p is a natural number.

The first to fourth clock pulses CLK1 to CLK4 are signals which are used to generate the scan pulses of the respective stages ST1 to STn. Each stage ST1 to STn receives one of the first to fourth clock pulses CLK1 to CLK4 and outputs the corresponding scan pulse. For example, the (4j+1)th stage receives the first clock pulse CLK1 and outputs the corresponding scan pulse, the (4j+2)th stage receives the second clock pulse CLK2 and outputs the corresponding scan pulse, the (4j+3)th stage receives the third clock pulse CLK3 and outputs the corresponding scan pulse, and the (4j+4)th stage receives the fourth clock pulse CLK4 and outputs the corresponding scan pulse. Here, j is a natural number including 0. On the other hand, the upper dummy stage ST0 receives the fourth clock pulse CLK4 and outputs the first dummy scan pulse Vout0, and the lower dummy stage STn+1 receives the first clock pulse CLK1 and outputs the second dummy scan pulse Voutn+1.

Although four types of clock pulses having different phases are used for illustrative purposes in the present invention, any number of types of clock pulses may be used as long as they are two or more.

The first to fourth clock pulses CLK1 to CLK4 are outputted out of phase with one another. That is, the second clock pulse CLK2 is outputted after being phase-delayed from the first clock pulse CLK1, and the third clock pulse CLK3 is outputted after being phase-delayed from the second clock pulse CLK2. The fourth clock pulse CLK4 is outputted after being phase-delayed from the third clock pulse CLK3, and the first clock pulse CLK1 is outputted after being phase-delayed from the fourth clock pulse CLK4.

The first to fourth clock pulses CLK1 to CLK4 are outputted sequentially and cyclically. In other words, the first to fourth clock pulses CLK1 to CLK4 are outputted sequentially from the first clock pulse CLK1 to the fourth clock pulse CLK4 and, thereafter, again from the first clock pulse CLK1 to the fourth clock pulse CLK4. As a result, the first clock pulse CLK1 is outputted in a period between the fourth clock pulse CLK4 and the second clock pulse CLK2.

The start pulse Vst is outputted only once for one frame period, whereas each of the clock pulses CLK1 to CLK4 is outputted several times for one frame period. In other words, the start pulse Vst exhibits its active state (high state) only once for one frame period, whereas each of the clock pulses CLK1 to CLK4 exhibits its active state periodically several times for one frame period. This start pulse Vst is outputted earlier than any clock pulses CLK1 to CLK4 in a given frame period.

In the forward driving, the clock pulses CLK1 to CLK4 are outputted in order from the first clock pulse CLK1 to the fourth clock pulse CLK4, as shown in FIG. 2. In contrast, in the reverse driving, the clock pulses CLK1 to CLK4 are outputted in order from the fourth clock pulse CLK4 to the first clock pulse CLK1, as shown in FIG. 3.

In the present invention, the first to fourth clock pulses CLK1 to CLK4 have pulse widths overlapping with one another, as shown in FIGS. 2 and 3.

That is, as shown in FIG. 2, the first half of the pulse width of an ith clock pulse (where i is a natural number which is greater than or equal to 2) overlaps with the second half of the pulse width of an (i−1)th clock pulse, and the second half of the pulse width of the ith clock pulse overlaps with the first half of the pulse width of an (i+1)th clock pulse.

Also, as shown in FIG. 3, the first half of the pulse width of an ith clock pulse overlaps with the second half of the pulse width of an (i+1)th clock pulse, and the second half of the pulse width of the ith clock pulse overlaps with the first half of the pulse width of an (i−1)th clock pulse.

For example, provided that each of the first to fourth clock pulses CLK1 to CLK4 has a pulse width corresponding to a 2 horizontal time 2H, the adjacent clock pulses may overlap with each other by a period corresponding to a 1 horizontal time 1H, as shown in FIGS. 2 and 3.

The pulse width overlap period is not limited to the half pulse width, and is adjustable to any period.

Using the clock pulses CLK1 to CLK4 overlapping in this manner, the pulse widths of the scan pulses outputted from the respective stages ST1 to STn also overlap with one another.

The upper and lower dummy stages ST0 and STn+1 and the stages ST1 to STn shown in FIG. 1 are supplied and operated with the various signals having the above-stated characteristics.

Each stage ST1 to STn must first be enabled, in order to output the corresponding scan pulse. That each stage is enabled means that each stage is set to an output enable state, namely, a state capable of outputting the clock pulse supplied thereto as the corresponding scan pulse.

In the forward driving, each stage ST1 to STn is enabled in response to a scan pulse from a stage upstream therefrom. For example, a jth stage is enabled in response to a scan pulse from a (j−2)th stage.

However, in the forward driving, the top stages, or first and second stages ST1 and ST2, are enabled in response to the first dummy scan pulse Vout0 from the upper dummy stage ST0. The upper dummy stage ST0 is enabled in response to the start pulse Vst from a start transfer line.

In contrast, in the reverse driving, each stage ST1 to STn is enabled in response to a scan pulse from a stage downstream therefrom. For example, a jth stage is enabled in response to a scan pulse from a (j+2)th stage.

However, in the reverse driving, the bottom stages, or nth and (n−1)th stages STn and STn−1, are enabled in response to the second dummy scan pulse Voutn+1 from the lower dummy stage STn+1. The lower dummy stage STn+1 is enabled in response to the start pulse Vst from the start transfer line.

On the other hand, each stage ST1 to STn is disabled after outputting the corresponding scan pulse. That each stage is disabled means that each stage is reset to an output disable state, namely, a state incapable of outputting the clock pulse supplied thereto as the corresponding scan pulse.

In the forward driving, each stage ST1 to STn is disabled in response to a scan pulse from a stage downstream therefrom. For example, a jth stage is disabled in response to a scan pulse from a (j+2)th stage.

However, in the forward driving, the bottom stages, or nth stage STn and (n−1)th stage STn−1, are disabled in response to the second dummy scan pulse Voutn+1 from the lower dummy stage STn+1. The lower dummy stage STn+1 is disabled in response to the start pulse Vst from the start transfer line.

In contrast, in the reverse driving, each stage ST1 to STn is disabled in response to a scan pulse from a stage upstream therefrom. For example, a jth stage is disabled in response to a scan pulse from a (j−2)th stage.

However, in the reverse driving, the top stages, or first and second stages ST1 and ST2, are disabled in response to the first dummy scan pulse Vout0 from the upper dummy stage ST0. The upper dummy stage ST0 is disabled in response to the start pulse Vst from the start transfer line.

Each of the stages ST0 to STn+1 includes a set node Q, a pull-up switching device Trpu for outputting the corresponding scan pulse according to the logic state of the set node Q, a first reset node QB1, a first pull-down switching device Trpd1 connected to the first reset node QB1, a second reset node QB2, a second pull-down switching device Trpd2 connected to the second reset node QB2, and a node controller for controlling the logic states of the nodes of a corresponding stage along with the logic states of the nodes of stages different from the corresponding stage. Also, the node controllers of the stages ST0 to STn+1 control the output order of the scan pulses from the stages ST0 to STn+1 according to the forward voltage and reverse voltage, which have opposite phases.

Here, the first reset node QB1 of a (2n−1)th stage and the second reset node QB2 of a (2n)th stage are connected to each other, the second reset node QB2 of the (2n−1)th stage and the first reset node QB1 of the (2n)th stage are connected to each other, the set node Q of a (2n−2)th stage is connected to the gate terminal of a switching device of the (2n−1)th stage, and the set node Q of the (2n−1)th stage is connected to the gate terminal of a switching device of the (2n−2)th stage.

The configuration of each of the stages ST1 to STn of the shift register, configured in this manner, including the upper and lower dummy stages ST0 and STn+1, will hereinafter be described in more detail.

Figure 4:
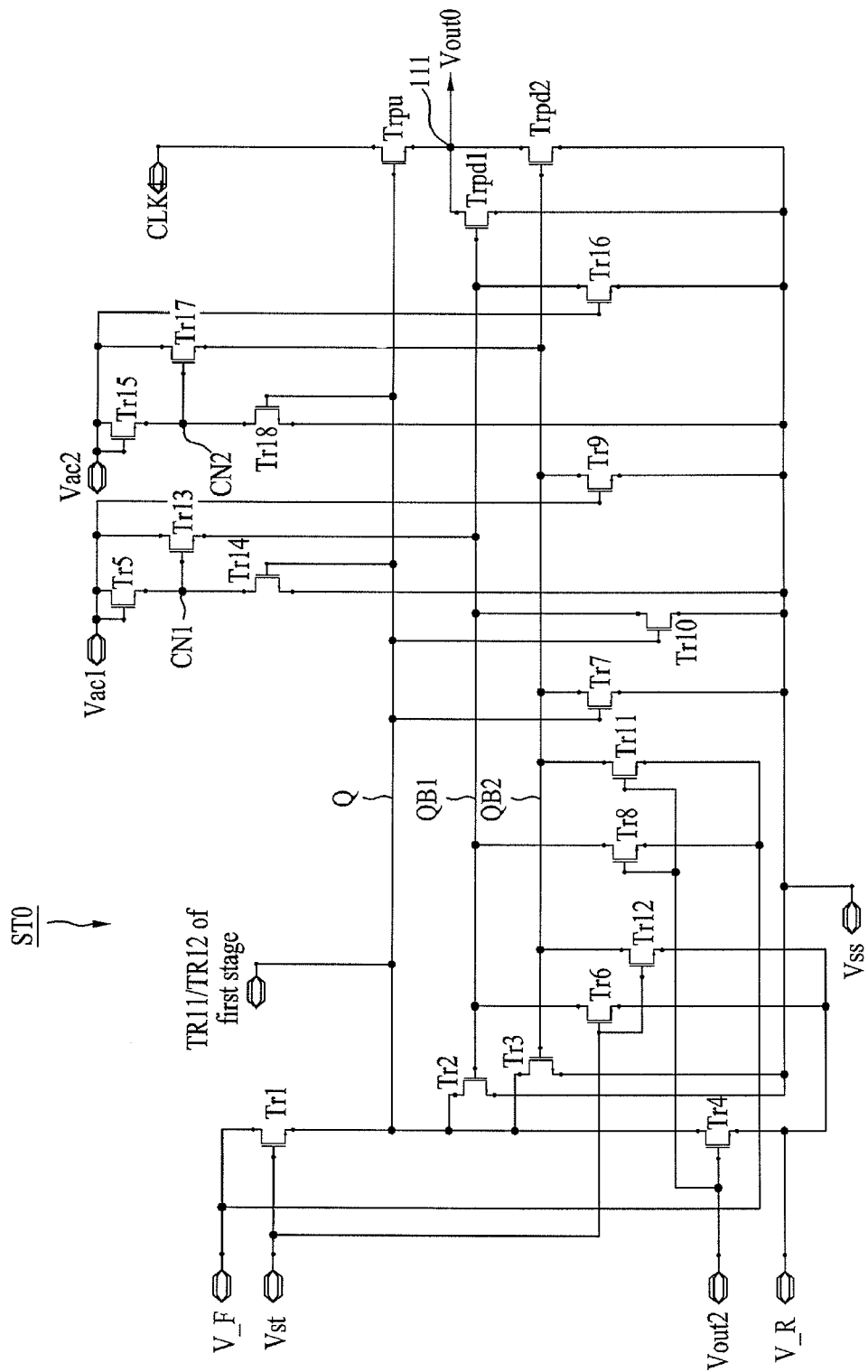
FIG. 4 is a circuit diagram of an upper dummy stage in FIG. 1.

FIG. 4 is a circuit diagram of the upper dummy stage ST0 in FIG. 1.

The upper dummy stage ST0 includes a node controller and an output unit, as shown in FIG. 4.

The node controller includes first to eighteenth switching devices Tr1 to Tr18.

The first switching device Tr1 is turned on/off in response to the external start pulse Vst, and interconnects a forward voltage line transferring the forward voltage V_F and the set node Q of the upper dummy stage ST0 when being turned on.

The second switching device Tr2 is turned on/off according to the voltage level of the first reset node QB1 of the upper dummy stage ST0, and interconnects the set node Q of the upper dummy stage ST0 and a discharging voltage line transferring a discharging voltage VSS when being turned on.

The third switching device Tr3 is turned on/off according to the voltage level of the second reset node QB2 of the upper dummy stage ST0, and interconnects the set node Q of the upper dummy stage ST0 and the discharging voltage line when being turned on.

The fourth switching device Tr4 is turned on/off in response to the scan pulse from the second stage ST2, and interconnects the set node Q of the upper dummy stage ST0 and a reverse voltage line transferring the reverse voltage V_R when being turned on.

The fifth switching device Tr5 is turned on/off according to the first AC voltage Vac1, and interconnects a first AC voltage line transferring the first AC voltage Vac1 and a first common node CN1 of the upper dummy stage ST0 when being turned on.

The sixth switching device Tr6 is turned on/off in response to the start pulse Vst, and interconnects the reverse voltage line and the first reset node QB1 of the upper dummy stage ST0 when being turned on.

The seventh switching device Tr7 is turned on/off according to the voltage level of the set node Q of the upper dummy stage ST0, and interconnects the second reset node QB2 of the upper dummy stage ST0 and the discharging voltage line when being turned on.

The eighth switching device Tr8 is turned on/off in response to the scan pulse from the second stage ST2, and interconnects the first reset node QB1 of the upper dummy stage ST0 and the forward voltage line when being turned on.

The ninth switching device Tr9 is turned on/off according to the first AC voltage Vac1, and interconnects the second reset node QB2 of the upper dummy stage ST0 and the discharging voltage line when being turned on.

The tenth switching device Tr10 is turned on/off according to the voltage level of the set node Q of the upper dummy stage ST0, and interconnects the first reset node QB1 of the upper dummy stage ST0 and the discharging voltage line when being turned on.

The eleventh switching device Tr11 is turned on/off in response to the scan pulse from the second stage ST2, and interconnects the second reset node QB2 of the upper dummy stage ST0 and the forward voltage line when being turned on.

The twelfth switching device Tr12 is turned on/off in response to the start pulse Vst, and interconnects the reverse voltage line and the second reset node QB2 of the upper dummy stage ST0 when being turned on.

The thirteenth switching device Tr13 is turned on/off according to the voltage level of the first common node CN1 of the upper dummy stage ST0, and interconnects the first AC voltage line and the first reset node QB1 of the upper dummy stage ST0 when being turned on.

The fourteenth switching device Tr14 is turned on/off according to the voltage level of the set node Q of the upper dummy stage ST0, and interconnects the first common node CN1 of the upper dummy stage ST0 and the discharging voltage line when being turned on.

The fifteenth switching device Tr15 is turned on/off according to the second AC voltage Vac2, and interconnects a second AC voltage line transferring the second AC voltage Vac2 and a second common node CN2 of the upper dummy stage ST0 when being turned on.

The sixteenth switching device Tr16 is turned on/off according to the second AC voltage Vac2, and interconnects the first reset node QB1 of the upper dummy stage ST0 and the discharging voltage line when being turned on.

The seventeenth switching device Tr17 is turned on/off according to the voltage level of the second common node CN2 of the upper dummy stage ST0, and interconnects the second AC voltage line and the second reset node QB2 of the upper dummy stage ST0 when being turned on.

The eighteenth switching device Tr18 is turned on/off according to the voltage level of the set node Q of the upper dummy stage ST0, and interconnects the second common node CN2 of the upper dummy stage ST0 and the discharging voltage line when being turned on.

Here, the set node Q of the upper dummy stage ST0 is connected to a switching device of the first stage ST1.

The output unit includes the pull-up switching device Trpu, and the first and second pull-down switching devices Trpd1 and Trpd2.

The pull-up switching device Trpu is turned on/off according to the signal state of the set node Q of the upper dummy stage ST0, and interconnects any one of clock transfer lines transferring the clock pulses CLK1 to CLK4 and an output terminal 111 when being turned on.

The first pull-down switching device Trpd1 is turned on/off according to the signal state of the first reset node QB1 of the upper dummy stage ST0, and interconnects the output terminal 111 and the discharging voltage line when being turned on.

The second pull-down switching device Trpd2 is turned on/off according to the signal state of the second reset node QB2 of the upper dummy stage ST0, and interconnects the output terminal 111 and the discharging voltage line when being turned on.

Figure 5:
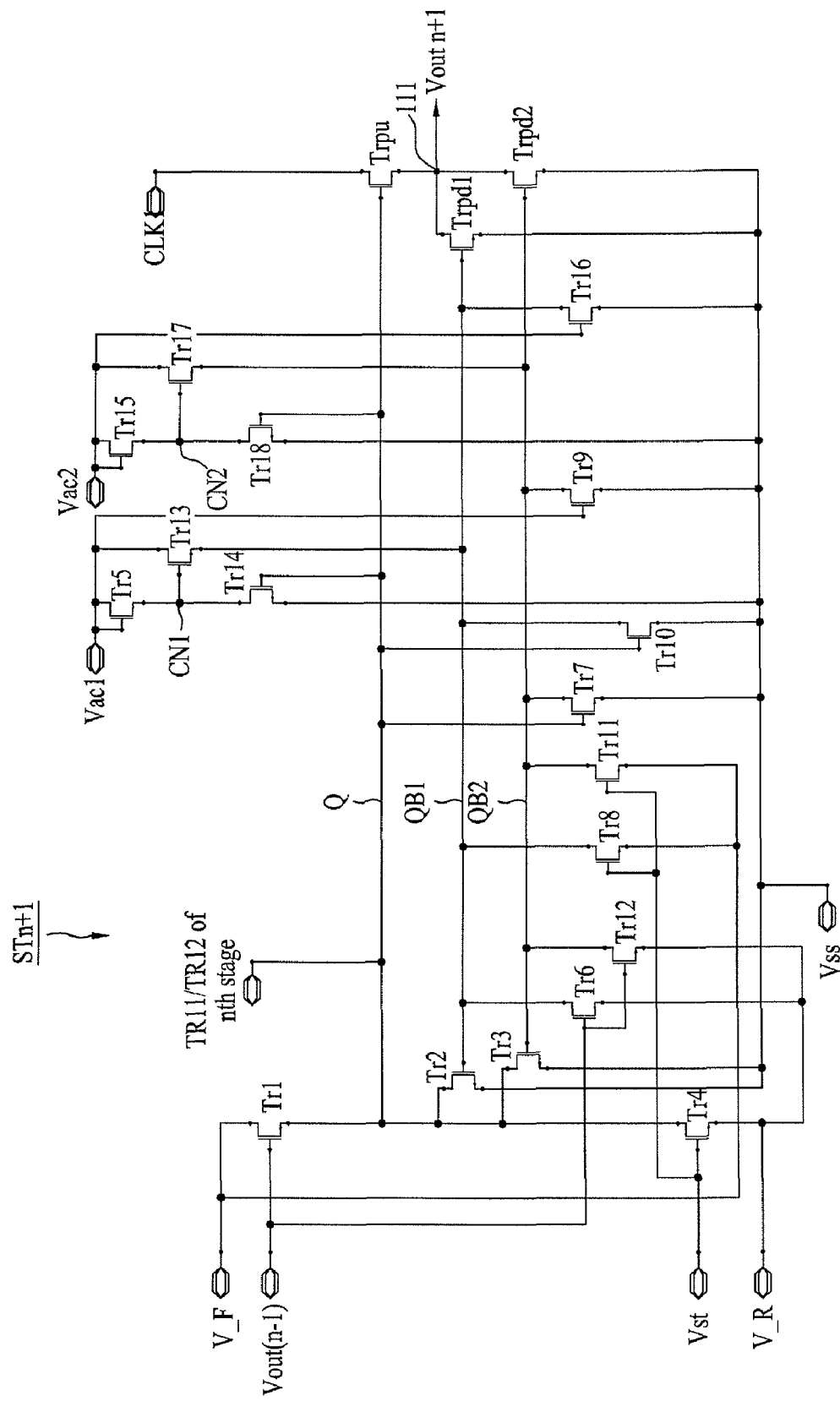
FIG. 5 is a circuit diagram of a lower dummy stage in FIG. 1.

FIG. 5 is a circuit diagram of the lower dummy stage STn+1 in FIG. 1.

The lower dummy stage STn+1 includes a node controller and an output unit, as shown in FIG. 5.

The node controller includes first to eighteenth switching devices Tr1 to Tr18.

The first switching device Tr1 is turned on/off in response to the scan pulse from the (n−1)th stage, and interconnects the forward voltage line transferring the forward voltage V_F and the set node Q of the lower dummy stage STn+1 when being turned on.

The second switching device Tr2 is turned on/off according to the voltage level of the first reset node QB1 of the lower dummy stage STn+1, and interconnects the set node Q of the lower dummy stage STn+1 and the discharging voltage line transferring the discharging voltage VSS when being turned on.

The third switching device Tr3 is turned on/off according to the voltage level of the second reset node QB2 of the lower dummy stage STn+1, and interconnects the set node Q of the lower dummy stage STn+1 and the discharging voltage line when being turned on.

The fourth switching device Tr4 is turned on/off in response to the external start pulse Vst, and interconnects the set node Q of the lower dummy stage STn+1 and the reverse voltage line transferring the reverse voltage V_R when being turned on.

The fifth switching device Tr5 is turned on/off according to the first AC voltage Vac1, and interconnects the first AC voltage line transferring the first AC voltage Vac1 and a first common node CN1 of the lower dummy stage STn+1 when being turned on.

The sixth switching device Tr6 is turned on/off in response to the scan pulse from the (n−1)th stage, and interconnects the reverse voltage line and the first reset node QB1 of the lower dummy stage STn+1 when being turned on.

The seventh switching device Tr7 is turned on/off according to the voltage level of the set node Q of the lower dummy stage STn+1, and interconnects the second reset node QB2 of the lower dummy stage STn+1 and the discharging voltage line when being turned on.

The eighth switching device Tr8 is turned on/off in response to the start pulse Vst, and interconnects the first reset node QB1 of the lower dummy stage STn+1 and the forward voltage line when being turned on.

The ninth switching device Tr9 is turned on/off according to the first AC voltage Vac1, and interconnects the second reset node QB2 of the lower dummy stage STn+1 and the discharging voltage line when being turned on.

The tenth switching device Tr10 is turned on/off according to the voltage level of the set node Q of the lower dummy stage STn+1, and interconnects the first reset node QB1 of the lower dummy stage STn+1 and the discharging voltage line when being turned on.

The eleventh switching device Tr11 is turned on/off in response to the start pulse Vst, and interconnects the second reset node QB2 of the lower dummy stage STn+1 and the forward voltage line when being turned on.

The twelfth switching device Tr12 is turned on/off in response to the scan pulse from the (n−1)th stage, and interconnects the reverse voltage line and the second reset node QB2 of the lower dummy stage STn+1 when being turned on.

The thirteenth switching device Tr13 is turned on/off according to the voltage level of the first common node CN1 of the lower dummy stage STn+1, and interconnects the first AC voltage line and the first reset node QB1 of the lower dummy stage STn+1 when being turned on.

The fourteenth switching device Tr14 is turned on/off according to the voltage level of the set node Q of the lower dummy stage STn+1, and interconnects the first common node CN1 of the lower dummy stage STn+1 and the discharging voltage line when being turned on.

The fifteenth switching device Tr15 is turned on/off according to the second AC voltage Vac2, and interconnects the second AC voltage line transferring the second AC voltage Vac2 and a second common node CN2 of the lower dummy stage STn+1 when being turned on.

The sixteenth switching device Tr16 is turned on/off according to the second AC voltage Vac2, and interconnects the first reset node QB1 of the lower dummy stage STn+1 and the discharging voltage line when being turned on.

The seventeenth switching device Tr17 is turned on/off according to the voltage level of the second common node CN2 of the lower dummy stage STn+1, and interconnects the second AC voltage line and the second reset node QB2 of the lower dummy stage STn+1 when being turned on.

The eighteenth switching device Tr18 is turned on/off according to the voltage level of the set node Q of the lower dummy stage STn+1, and interconnects the second common node CN2 of the lower dummy stage STn+1 and the discharging voltage line when being turned on.

Here, the set node Q of the lower dummy stage STn+1 is connected to a switching device of the nth stage STn.

The output unit includes the pull-up switching device Trpu, and the first and second pull-down switching devices Trpd1 and Trpd2.

The pull-up switching device Trpu is turned on/off according to the signal state of the set node Q of the lower dummy stage STn+1, and interconnects any one of the clock transfer lines transferring the clock pulses CLK1 to CLK4 and an output terminal 111 when being turned on.

The first pull-down switching device Trpd1 is turned on/off according to the signal state of the first reset node QB1 of the lower dummy stage STn+1, and interconnects the output terminal 111 and the discharging voltage line when being turned on.

The second pull-down switching device Trpd2 is turned on/off according to the signal state of the second reset node QB2 of the lower dummy stage STn+1, and interconnects the output terminal 111 and the discharging voltage line when being turned on.

Figure 6:
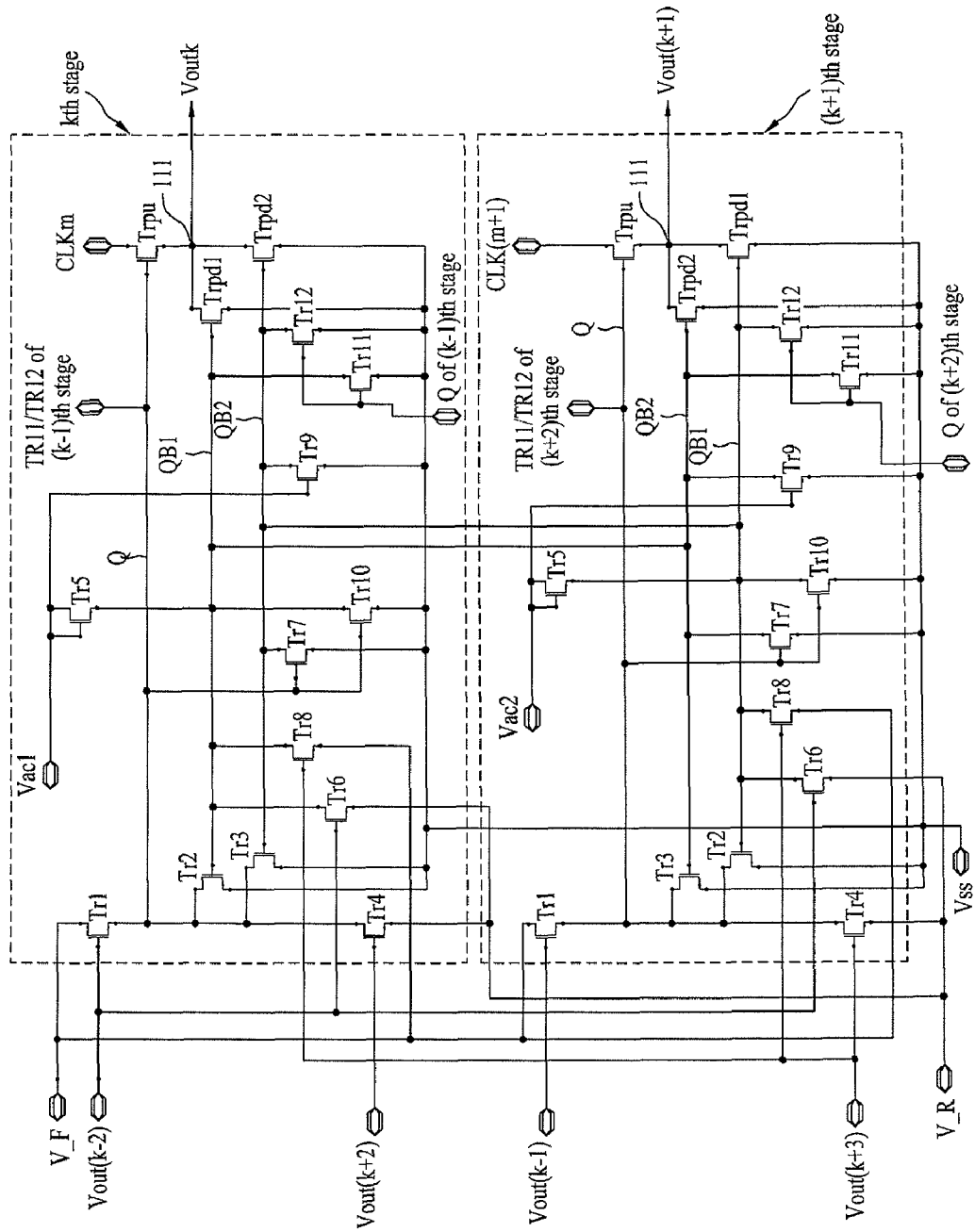
FIG. 6 is a circuit diagram of two arbitrary stages in FIG. 1.

FIG. 6 is a circuit diagram of two arbitrary stages in FIG. 1.

Each stage ST1 to STn includes a node controller and an output unit, as shown in FIG. 6.

The node controller of a kth stage includes first to twelfth switching devices Tr11 to Tr12. Here, k is a natural number.

The first switching device Tr1 is turned on/off in response to a scan pulse from a (k−2)th stage, and interconnects the forward voltage line transferring the forward voltage V_F and the set node Q of the kth stage when being turned on.

The second switching device Tr2 is turned on/off according to the voltage level of the first reset node QB1 of the kth stage, and interconnects the set node Q of the kth stage and the discharging voltage line transferring the discharging voltage VSS when being turned on.

The third switching device Tr3 is turned on/off according to the voltage level of the second reset node QB2 of the kth stage, and interconnects the set node Q of the kth stage and the discharging voltage line when being turned on.

The fourth switching device Tr4 is turned on/off in response to a scan pulse from a (k+2)th stage, and interconnects the set node Q of the kth stage and the reverse voltage line transferring the reverse voltage V_R when being turned on.

The fifth switching device Tr5 is turned on/off according to any one of the first and second AC voltages Vac1 and Vac2, and interconnects any one of the first AC voltage line transferring the first AC voltage Vac1 and the second AC voltage line transferring the second AC voltage Vac2 and the first reset node QB1 of the kth stage when being turned on.

The sixth switching device Tr6 is turned on/off in response to any one of the scan pulse from the (k−2)th stage and a scan pulse from a (k−3)th stage, and interconnects the reverse voltage line and the first reset node QB1 of the kth stage when being turned on.

The seventh switching device Tr7 is turned on/off according to the voltage level of the set node Q of the kth stage, and interconnects the second reset node QB2 of the kth stage and the discharging voltage line when being turned on.

The eighth switching device Tr8 is turned on/off in response to any one of the scan pulse from the (k+2)th stage and a scan pulse from a (k+3)th stage, and interconnects the first reset node QB1 of the kth stage and the forward voltage line when being turned on.

The ninth switching device Tr9 is turned on/off according to any one of the first and second AC voltages Vac1 and Vac2, and interconnects the second reset node QB2 of the kth stage and the discharging voltage line when being turned on.

The tenth switching device Tr10 is turned on/off according to the voltage level of the set node Q of the kth stage, and interconnects the first reset node QB1 of the kth stage and the discharging voltage line when being turned on.

The eleventh switching device Tr11 is turned on/off according to the voltage level of any one of the set nodes Q of (k−1)th and (k+1)th stages, and interconnects any one of the first and second reset nodes QB1 and QB2 of the kth stage and the discharging voltage line when being turned on.

The twelfth switching device Tr12 is turned on/off according to the voltage level of any one of the set nodes Q of the (k−1)th and (k+1)th stages, and interconnects any one of the first and second reset nodes QB1 and QB2 of the kth stage and the discharging voltage line when being turned on.

Here, the fifth switching device Tr5 of a (2k−1)th stage is supplied with the first AC voltage Vac1, the fifth switching device Tr5 of a (2k)th stage is supplied with the second AC voltage Vac2, the sixth switching device Tr6 of each of the (2k−1)th and (2k)th stages is supplied with a scan pulse from a (2k−3)th stage, the eighth switching device Tr8 of each of the (2k−1)th and (2k)th stages is supplied with a scan pulse from a (2k+2)th stage, the ninth switching device Tr9 of the (2k−1)th stage is supplied with the first AC voltage Vac1, and the ninth switching device Tr9 of the (2k)th stage is supplied with the second AC voltage Vac2. Also, the eleventh switching device Tr11 of the (2k−1)th stage is turned on/off according to the voltage level of the set node Q of a (2k−2)th stage, and interconnects the first reset node QB1 of the (2k−1)th stage and the discharging voltage line when being turned on. The eleventh switching device Tr11 of the (2k)th stage is turned on/off according to the voltage level of the set node Q of a (2k+1)th stage, and interconnects the second reset node QB2 of the (2k)th stage and the discharging voltage line when being turned on. The twelfth switching device Tr12 of the (2k−1)th stage is turned on/off according to the voltage level of the set node Q of the (2k−2)th stage, and interconnects the second reset node QB2 of the (2k−1)th stage and the discharging voltage line when being turned on. The twelfth switching device Tr12 of the (2k)th stage is turned on/off according to the voltage level of the set node Q of the (2k+1)th stage, and interconnects the second reset node QB2 of the (2k)th stage and the discharging voltage line when being turned on.

The output unit includes the pull-up switching device Trpu, and the first and second pull-down switching devices Trpd1 and Trpd2.

The pull-up switching device Trpu is turned on/off according to the signal state of the set node Q of the kth stage, and interconnects any one of the clock transfer lines transferring the clock pulses CLK1 to CLK4 and an output terminal 111 when being turned on.

The first pull-down switching device Trpd1 is turned on/off according to the signal state of the first reset node QB1 of the kth stage, and interconnects the output terminal 111 and the discharging voltage line when being turned on.

The second pull-down switching device Trpd2 is turned on/off according to the signal state of the second reset node QB2 of the kth stage, and interconnects the output terminal 111 and the discharging voltage line when being turned on.

The operation of the shift register with the above-stated configuration will hereinafter be described.

A description will first be given of the operation of the shift register based on the forward driving with reference to FIGS. 2, 4, 5 and 6.

Because the operation of the shift register is based on the forward driving, the clock pulses CLK1 to CLK4 are outputted in order from the first clock pulse CLK1 to the fourth clock pulse CLK4, the forward voltage V_F is in the high state, and the reverse voltage V_R is in the low state, as shown in FIG. 2.

First, a description will be given of an operation in a first initial period Ts of a first frame period.

In the first frame period, the first AC voltage Vac1 is positive and the second AC voltage Vac2 is negative.

In the first initial period Ts, only the start pulse Vst, outputted from a timing controller, is maintained in the high state and the clock pulses CLK1 to CLK4, outputted from the timing controller, are maintained in the low state, as shown in FIG. 2.

The start pulse Vst outputted from the timing controller is supplied to the upper dummy stage ST0 and the lower dummy stage STn+1.

That is, as shown in FIG. 4, the start pulse Vst is supplied to the gate terminals of the first, sixth and twelfth switching devices Tr1, Tr6 and Tr12 in the upper dummy stage ST0. As a result, the first switching device Tr1 is turned on and the forward voltage V_F of the high state is supplied to the set node Q through the turned-on first switching device Tr1. Consequently, the set node Q is charged and the pull-up switching device Trpu and third switching device Tr3 of the upper dummy stage ST0, connected to the charged set node Q through the gate terminals thereof, are thus turned on. Because the set node Q of the upper dummy stage ST0 is also connected to the gate terminals of the eleventh and twelfth switching devices Tr11 and Tr12 of the first stage ST1, the eleventh and twelfth switching devices Tr11 and Tr12 of the first stage ST1 are also turned on.

Also, as the sixth switching device Tr6 is turned on, the reverse voltage V_R of the low state is supplied to the first reset node QB1, thereby causing the first reset node QB1 to be discharged. Also, as the twelfth switching device Tr12 is turned on, the reverse voltage V_R of the low state is supplied to the second reset node QB2, thereby causing the second reset node QB2 to be discharged.

The seventh, tenth, fourteenth and eighteenth switching devices Tr7, Tr10, Tr14 and Tr18 and the pull-up switching device Trpu, connected to the charged set node Q through the gate terminals thereof, are turned on.

The first pull-down switching device Trpd1, connected to the discharged first reset node QB1 through the gate terminal thereof, and the second pull-down switching device Trpd2, connected to the discharged second reset node QB2 through the gate terminal thereof, are turned off.

On the other hand, because the scan pulse from the second stage ST2 is in the low state in the first initial period Ts, the fourth, eighth and eleventh switching devices Tr4, Tr8 and Tr11, supplied with the scan pulse from the second stage ST2 through the gate terminals thereof, are turned off.

Also, the fifth and ninth switching devices Tr5 and Tr9 supplied with the first AC voltage Vac1 of the high state are turned on and the first AC voltage Vac1 is supplied to the first common node CN1 through the turned-on fifth switching device Tr5. As a result, two voltages having different polarities are supplied to the first common node CN1. That is, the first common node CN1 is supplied with the discharging voltage VSS of the low state, outputted through the turned-on fourteenth switching device Tr14, and the first AC voltage Vac1 of the high state, outputted through the turned-on fifth switching device Tr5. However, because the channel area of the fourteenth switching device Tr14 is set to be larger than that of the fifth switching device Tr5, the first common node CN1 is kept discharged by the discharging voltage VSS supplied through the fourteenth switching device Tr14. Accordingly, the thirteenth switching device Tr13, connected to the discharged first common node CN1 through the gate terminal thereof, is turned off.

The turned-on ninth switching device Tr9 supplies the discharging voltage VSS to the second reset node QB2, so as to discharge the second reset node QB2.

The fifteenth and sixteenth switching devices Tr15 and Tr16 supplied with the second AC voltage Vac2 of the low state are turned off.

The second common node CN2 is discharged by the discharging voltage VSS supplied through the turned-on eighteenth switching device Tr18 and the seventeenth switching device Tr17, connected to the discharged second common node CN2 through the gate terminal thereof, is turned off.

In this manner, in the first initial period Ts, the set node Q of the upper dummy stage ST0 is charged and the first and second reset nodes QB1 and QB2 thereof are discharged. That is, in the first initial period Ts, the upper dummy stage ST0 is set.

Meanwhile, in the first initial period Ts, the lower dummy stage STn+1 supplied with the start pulse Vst is reset, which will hereinafter be described in more detail.

That is, as shown in FIG. 5, the start pulse Vst is supplied to the gate terminals of the fourth, eighth and eleventh switching devices Tr4, Tr8 and Tr11 in the lower dummy stage STn+1. As a result, the fourth switching device Tr4 is turned on and the reverse voltage V_R of the low state is supplied to the set node Q through the turned-on fourth switching device Tr4. Consequently, the set node Q is discharged and the seventh, tenth, fourteenth and eighteenth switching devices Tr7, Tr10, Tr14 and Tr18 and the pull-up switching device Trpu, connected to the discharged set node Q through the gate terminals thereof, are thus turned off. Because the set node Q of the lower dummy stage STn+1 is also connected to the gate terminals of the eleventh and twelfth switching devices Tr11 and Tr12 of the nth stage STn, the eleventh and twelfth switching devices Tr11 and Tr12 of the nth stage STn are also turned off.

Because the scan pulse from the (n–1)th stage STn–1 is in the low state in the first initial period Ts, the first, sixth and twelfth switching devices Tr1, Tr6 and Tr12, supplied with the scan pulse from the (n–1)th stage STn–1 through the gate terminals thereof, are turned off.

Also, the fifth and ninth switching devices Tr5 and Tr9 supplied with the first AC voltage Vac1 of the high state are turned on and the first AC voltage Vac1 is supplied to the first common node CN1 through the turned-on fifth switching device Tr5, thereby causing the first common node CN1 to be charged. Accordingly, the thirteenth switching device Tr13, connected to the charged first common node CN1 through the gate terminal thereof, is turned on. The first AC voltage Vac1 is supplied to the first reset node QB1 through the turned-on thirteenth switching device Tr13, so as to charge the first reset node QB1

The turned-on ninth switching device Tr9 supplies the discharging voltage VSS to the second reset node QB2, so as to discharge the second reset node QB2.

The fifteenth and sixteenth switching devices Tr15 and Tr16 supplied with the second AC voltage Vac2 of the low state are turned off.

Because the second common node CN2 is discharged, the seventeenth switching device Tr17 is turned off.

The forward voltage V_F is supplied to the first reset node QB1 through the turned-on eighth switching device Tr8, so as to charge the first reset node QB1. As a result, the second switching device Tr2 and first pull-down switching device Trpd1, connected to the charged first reset node QB1 through the gate terminals thereof, are turned on. The turned-on first pull-down switching device Trpd1 outputs the discharging voltage VSS and supplies it to the (n−1)th and nth stages STn−1 and STn.

In contrast, although the forward voltage V_F is supplied to the second reset node QB2 through the turned-on eleventh switching device Tr11, the second reset node QB2 is kept discharged by the reverse voltage V_R and discharging voltage VSS supplied respectively through the turned-on twelfth and ninth switching devices Tr12 and Tr9. Accordingly, the third switching device Tr3 and second pull-down switching device Trpd2, connected to the discharged second reset node QB2 through the gate terminals thereof, are turned off.

In this manner, in the first initial period Ts, the lower dummy stage STn+1 is reset.

Thereafter, in a second initial period T0, the fourth clock pulse CLK4 is supplied to the drain terminal of the pull-up switching device Trpu in the upper dummy stage ST0. At this time, because the set node Q of the upper dummy stage ST0 is kept floating in the second initial period T0, a voltage maintained at the set node Q is bootstrapped by the fourth clock pulse CLK4 supplied to the pull-up switching device Trpu. The pull-up switching device Trpu outputs the fourth clock pulse CLK4 as the first dummy scan pulse Vout0.

The first dummy scan pulse Vout0 is supplied to the first and second stages ST1 and ST2, so as to set the first and second stages ST1 and ST2.

In other words, the first dummy scan pulse Vout0 outputted from the upper dummy stage ST0 is supplied to each of the gate terminals of the first and sixth switching devices Tr1 and Tr6 in the first stage ST1.

As a result, the first and sixth switching devices Tr1 and Tr6 are turned on and the forward voltage V_F of the high state is applied to the set node Q through the turned-on first switching device Tr1. Accordingly, the set node Q is charged and the pull-up switching device Trpu and the seventh and tenth switching devices Tr7 and Tr10, connected to the charged set node Q through the gate terminals thereof, are thus turned on.

The reverse voltage V_R and discharging voltage VSS of the low state are supplied to the first reset node QB1, respectively, through the turned-on sixth and tenth switching devices Tr6 and Tr10, thereby causing the first reset node QB1 to be discharged. As a result, the first pull-down switching device Trpd1 and the second switching device Tr2, connected to the first reset node QB1 through the gate terminals thereof, are turned off.

On the other hand, because the first AC voltage Vac1 is maintained in the high state for the first frame period, the fifth and ninth switching devices Tr5 and Tr9 supplied with the first AC voltage Vac1 are kept turned on for the first frame period. The first AC voltage Vac1 is supplied to the first reset node QB1 of the first stage ST1 through the turned-on fifth switching device Tr5. At this time, the discharging voltage VSS outputted through the turned-on tenth switching device Tr10 is also supplied to the first reset node QB1. That is, the first AC voltage Vac1 of the high state and the discharging voltage VSS of the low state are together supplied to the first reset node QB1.

Notably, because the size of each of the sixth and tenth switching devices Tr6 and Tr10 supplying the reverse voltage V_R and discharging voltage VSS is set to be larger than that of the fifth switching device Tr5 supplying the first AC voltage Vac1, the discharging voltage VSS is maintained at the first reset node QB1. On the other hand, the discharging voltage VSS outputted through the eleventh and twelfth switching devices Tr11 and Tr12 is further supplied to the first reset node QB1. The eleventh and twelfth switching devices Tr11 and Tr12 of the first stage ST1, which are connected to the set node Q of the upper dummy stage ST0, are kept turned on because the set node Q is kept charged in this period. As a result, the first reset node QB1 is discharged and the second switching device Tr2 and the first pull-down switching device Trpd1, connected to the discharged first reset node QB1 through the gate terminals thereof, are thus turned off.

On the other hand, the second reset node QB2 is discharged by the discharging voltage VSS supplied through the turned-on seventh, ninth and twelfth switching devices Tr7, Tr9 and Tr12. As a result, the third switching device Tr3 and the second pull-down switching device Trpd2, connected to the discharged second reset node QB2 through the gate terminals thereof, are thus turned off.

In this manner, in the second initial period T0, the set node Q of the first stage ST1 is charged and the first and second reset nodes QB1 and QB2 of the first stage ST1 are discharged. That is, in the second initial period T0, the first stage ST1 is set.

On the other hand, in this second initial period T0, the second stage ST2 is also set in response to the first dummy scan pulse Vout0 in a similar manner to the first stage ST1. Namely, although not shown in the drawings, the first dummy scan pulse Vout0 is supplied to the gate terminal of the first switching device Tr1 of the second stage ST2.

Accordingly, the set node Q of the second stage ST2 is charged and the first and second reset nodes QB1 and QB2 of the second stage ST2 are reset, because the first reset node QB1 of the second stage ST2 is connected to the second reset node QB2 of the first stage ST1 and the second reset node QB2 of the second stage ST2 is connected to the first reset node QB1 of the first stage ST1.

Meanwhile, in the second initial period T0, the fifth and ninth switching devices Tr5 and Tr9 of the second stage ST2 are turned off, because the second AC voltage Vac2 supplied to the gate terminals of the fifth and ninth switching devices Tr5 and Tr9 is in the low state.

Next, a description will be given of an operation in a first period T1.

In the first period T1, only the fourth and first clock pulses CLK4 and CLK1 are maintained in the high state, and the remaining clock pulses CLK2 and CLK3, including the start pulse Vst, are maintained in the low state, as shown in FIG. 2.

The first and second stages ST1 and ST2 repeat the above-stated setting operations once more in response to the fourth clock pulse CLK4.

Also, in the first period T1, as the pull-up switching device Trpu of the first stage ST1 is supplied with the first clock pulse CLK1, it outputs the first clock pulse CLK1 as the first scan pulse Vout1 and supplies it to the first gate line and third stage ST3. At this time, because the set node Q of the first stage ST1 is kept floating in the first period T1, a voltage maintained at the set node Q is bootstrapped by the first clock pulse CLK1 supplied to the pull-up switching device Trpu.

Next, a description will be given of an operation in a second period T2.

In the second period T2, only the first and second clock pulses CLK1 and CLK2 are maintained in the high state, and the remaining clock pulses CLK3 and CLK4, including the start pulse Vst, are maintained in the low state.

The pull-up switching device Trpu in the first stage ST1 outputs the first scan pulse Vout1 in a complete form in response to the first clock pulse CLK1. In this second period T2, the third stage ST3 is set by the first scan pulse Vout1.

Also, the pull-up switching device Trpu in the second stage ST2 begins to output the second scan pulse Vout2 in response to the second clock pulse CLK2. That is, the pull-up switching device Trpu outputs the second clock pulse CLK2 as the second scan pulse Vout2 and supplies it to the second gate line, fourth stage ST4 and upper dummy stage ST0. At this time, because the set node Q of the second stage ST2 is kept floating in the second period T2, a voltage maintained at the set node Q is bootstrapped by the second clock pulse CLK2 supplied to the pull-up switching device Trpu.

Here, the second scan pulse from the second stage 5T2 resets the upper dummy stage ST0.

The resetting operation of the upper dummy stage ST0 will hereinafter be described in detail.

The second scan pulse Vout2 is supplied to the gate terminals of the fourth, eighth and eleventh switching devices Tr4, Tr8 and Tr1 in the upper dummy stage ST0. As a result, the fourth switching device Tr4 is turned on and the reverse voltage V_R of the low state is supplied to the set node Q through the turned-on fourth switching device Tr4. Consequently, the set node Q is discharged and the pull-up switching device Trpu and third switching device Tr3 of the upper dummy stage ST0, connected to the discharged set node Q through the gate terminals thereof, are thus turned off. Because the set node Q of the upper dummy stage ST0 is also connected to the gate terminals of the eleventh and twelfth switching devices Tr11 and Tr12 of the first stage ST1, the eleventh and twelfth switching devices Tr11 and Tr12 of the first stage ST1 are also turned off.

Also, as the eighth switching device Tr8 is turned on, the forward voltage V_F of the high state is supplied to the first reset node QB1, so as to charge the first reset node QB1. The first AC voltage Vac1 of the high state is also supplied to the first reset node QB1 through the turned-on thirteenth switching device Tr13. As a result, the second switching device Tr2 and first pull-down switching device Trpd1, connected to the charged first reset node QB1 through the gate terminals thereof, are turned on. The turned-on first pull-down switching device Trpd1 outputs the discharging voltage VSS.

In this manner, in the second period T2, the set node Q and second reset node QB2 of the upper dummy stage ST0 are discharged, and the first reset node QB1 of the upper dummy stage ST0 is charged. That is, in this second period T2, the upper dummy stage ST0 is reset.

Next, a description will be given of an operation in a third period T3.

In the third period T3, only the second and third clock pulses CLK2 and CLK3 are maintained in the high state, and the remaining clock pulses CLK1 and CLK4, including the start pulse Vst, are maintained in the low state.

In response to the second clock pulse CLK2, the pull-up switching device Trpu in the second stage ST2 outputs the second scan pulse Vout2 in a complete form and supplies it to the second gate line. Also, the pull-up switching device Trpu in the third stage ST3 begins to output the third scan pulse Vout3 in response to the third clock pulse CLK3.

In this third period T3, the third scan pulse Vout3 from the third stage ST3 is supplied to the third gate line to begin to drive the third gate line. Also, the third scan pulse Vout3 from the third stage ST3 is supplied to the fifth stage ST5 to set the fifth stage ST5, and supplied to the first stage ST1 to reset the first stage ST1.

On the other hand, in the third period T3, the third scan pulse Vout3 from the third stage ST3 is supplied to the third gate line, fifth stage ST5 and first stage ST1. At this time, the first stage ST1 is reset by the third scan pulse Vout3.

The resetting operation of the first stage ST1 will hereinafter be described in detail.

The third scan pulse Vout3 is supplied to the gate terminal of the fourth switching device Tr4 in the first stage ST1. As a result, the fourth switching device Tr4 is turned on. The reverse voltage V_R of the low state is supplied to the set node Q of the first stage ST1 through the turned-on fourth switching device Tr4. Consequently, the set node Q is discharged and the seventh, tenth, fourteenth and eighteenth switching devices Tr7, Tr10, Tr14 and Tr18 and the pull-up switching device Trpu, connected to the discharged set node Q through the gate terminals thereof, are thus turned off.

Here, because the sixth, eighth and eleventh switching devices Tr6, Tr8 and Tr11, including the tenth switching device Tr10, are kept turned off, the first reset node QB1 of the first stage ST1 is changed to its charged state by the first AC voltage Vac1 of the high state supplied through the fifth switching device Tr5 in this period. As a result, the second switching device Tr2 and first pull-down switching device Trpd1, connected to the charged first reset node QB1 through the gate terminals thereof, are turned on. The turned-on second switching device Tr2 supplies the discharging voltage VSS to the set node Q of the first stage ST1. Also, the turned-on first pull-down switching device Trpd1 outputs the discharging voltage VSS and supplies it to the first gate line and third stage ST3.

In this manner, in the third period T3, the set node Q and second reset node QB2 of the first stage ST1 are discharged and the first reset node QB1 of the first stage ST1 is charged, so that the first stage ST1 is reset.

Subsequently, the fifth and lower dummy stages ST5 to STn+1 are sequentially set and reset in the same manner as described above.

On the other hand, in a second frame period, the first AC voltage Vac1 is negative and the second AC voltage Vac2 is positive. Accordingly, in a reset period, the first reset node QB1 of each stage ST0 to STn+1 is discharged and the second reset node QB2 thereof is charged. Consequently, in the second frame period, the second pull-down switching device Trpd2 of each stage ST0 to STn+1 operates in the reset period.

Next, a description will be given of the operation of the shift register in the reverse driving, with reference to FIGS. 3, 4, 5 and 6.

Because the operation of the shift register is in the reverse driving, the clock pulses CLK1 to CLK4 are outputted in order from the fourth clock pulse CLK4 to the first clock pulse CLK1, the forward voltage V_F is in the low state, and the reverse voltage V_R is in the high state, as shown in FIG. 3.

First, a description will be given of an operation in a first initial period Ts of a first frame period.

In the first frame period, the first AC voltage Vac1 is positive and the second AC voltage Vac2 is negative.

In the first initial period Ts, only the start pulse Vst outputted from the timing controller is maintained in the high state and the clock pulses CLK1 to CLK4 outputted from the timing controller are maintained in the low state, as shown in FIG. 3.

The start pulse Vst outputted from the timing controller is supplied to the upper dummy stage ST0 and the lower dummy stage STn+1.

That is, as shown in FIG. 5, the start pulse Vst is supplied to the gate terminals of the fourth, eighth and eleventh switching devices Tr4, Tr8 and Tr11 in the lower dummy stage STn+1. As a result, the fourth, eighth and eleventh switching devices Tr4, Tr8 and Tr11 are turned on.

The reverse voltage V_R of the high state is supplied to the set node Q through the turned-on fourth switching device Tr4. Consequently, the set node Q is charged and the pull-up switching device Trpu and third switching device Tr3 of the lower dummy stage STn+1, connected to the charged set node Q through the gate terminals thereof, are thus turned on. Because the set node Q of the lower dummy stage STn+1 is also connected to the gate terminals of the eleventh and twelfth switching devices Tr11 and Tr12 of the nth stage STn, the eleventh and twelfth switching devices Tr11 and Tr12 of the nth stage STn are also turned on.

Also, as the eighth switching device Tr8 is turned on, the forward voltage V_F of the low state is supplied to the first reset node QB1 so as to discharge the first reset node QB1. Also, as the eleventh switching device Tr11 is turned on, the forward voltage V_F of the low state is supplied to the second reset node QB2 so as to discharge the second reset node QB2.

The seventh, tenth, fourteenth and eighteenth switching devices Tr7, Tr10, Tr14 and Tr18 and the pull-up switching device Trpu, connected to the charged set node Q through the gate terminals thereof, are turned on.

The first pull-down switching device Trpd1, connected to the discharged first reset node QB1 through the gate terminal thereof, and the second pull-down switching device Trpd2, connected to the discharged second reset node QB2 through the gate terminal thereof, are turned off.

On the other hand, because the scan pulse from the (n−1)th stage STn−1 is in the low state in the first initial period Ts, the first, sixth and twelfth switching devices Tr1, Tr6 and Tr12, supplied with the scan pulse from the (n−1)th stage STn−1 through the gate terminals thereof, are turned off.

Also, the fifth and ninth switching devices Tr5 and Tr9 supplied with the first AC voltage Vac1 of the high state are turned on and the first AC voltage Vac1 is supplied to the first common node CN1 through the turned-on fifth switching device Tr5. As a result, two voltages having different polarities are supplied to the first common node CN1. That is, the first common node CN1 is supplied with the discharging voltage VSS of the low state outputted through the turned-on fourteenth switching device Tr14 and the first AC voltage Vac1 of the high state outputted through the turned-on fifth switching device Tr5. However, because the channel area of the fourteenth switching device Tr14 is set to be larger than that of the fifth switching device Tr5, the first common node CN1 is kept discharged by the discharging voltage VSS supplied through the fourteenth switching device Tr14. Accordingly, the thirteenth switching device Tr13, connected to the discharged first common node CN1 through the gate terminal thereof, is turned off.

The turned-on ninth switching device Tr9 supplies the discharging voltage VSS to the second reset node QB2, so as to discharge the second reset node QB2.

The fifteenth and sixteenth switching devices Tr15 and Tr16 supplied with the second AC voltage Vac2 of the low state are turned off.

The second common node CN2 is discharged by the discharging voltage VSS supplied through the turned-on eighteenth switching device Tr18 and the seventeenth switching device Tr17, connected to the discharged second common node CN2 through the gate terminal thereof, is turned off.

In this manner, in the first initial period Ts, the set node Q of the lower dummy stage STn+1 is charged and the first and second reset nodes QB1 and QB2 thereof are discharged. That is, in the first initial period Ts, the lower dummy stage STn+1 is set.

Meanwhile, in the first initial period Ts, the upper dummy stage ST0 supplied with the start pulse Vst is reset, which will hereinafter be described in more detail.

That is, as shown in FIG. 4, the start pulse Vst is supplied to the gate terminals of the first, sixth and twelfth switching devices Tr1, Tr6 and Tr12 in the upper dummy stage ST0. As a result, the first, sixth and twelfth switching devices Tr1, Tr6 and Tr12 are turned on.

The forward voltage V_F of the low state is supplied to the set node Q through the turned-on first switching device Tr1. Consequently, the set node Q is discharged and the seventh, tenth, fourteenth and eighteenth switching devices Tr7, Tr10, Tr14 and Tr18 and the pull-up switching device Trpu, connected to the discharged set node Q through the gate terminals thereof, are thus turned off. Because the set node Q of the upper dummy stage ST0 is also connected to the gate terminals of the eleventh and twelfth switching devices Tr11 and Tr12 of the first stage ST1, the eleventh and twelfth switching devices Tr11 and Tr12 of the first stage ST1 are also turned off.

Because the scan pulse from the second stage ST2 is in the low state in the first initial period Ts, the fourth, eighth and eleventh switching devices Tr4, Tr8 and Tr11, supplied with the scan pulse from the second stage ST2 through the gate terminals thereof, are turned off.

Also, the fifth and ninth switching devices Tr5 and Tr9 supplied with the first AC voltage Vac1 of the high state are turned on and the first AC voltage Vac1 is supplied to the first common node CN1 through the turned-on fifth switching device Tr5, thereby causing the first common node CN1 to be charged. Accordingly, the thirteenth switching device Tr13, connected to the charged first common node CN1 through the gate terminal thereof, is turned on. The first AC voltage Vac1 is supplied to the first reset node QB1 through the turned-on thirteenth switching device Tr13, so as to charge the first reset node QB1.

The turned-on ninth switching device Tr9 supplies the discharging voltage VSS to the second reset node QB2, so as to discharge the second reset node QB2. The third switching device Tr3 and second pull-down switching device Trpd2, connected to the discharged second reset node QB2 through the gate terminals thereof, are turned off.

The fifteenth and sixteenth switching devices Tr15 and Tr16 supplied with the second AC voltage Vac2 of the low state are turned off.

Because the second common node CN2 is discharged, the seventeenth switching device Tr17 is turned off.

The turned-on first pull-down switching device Trpd1 outputs the discharging voltage VSS and supplies it to the first and second stages ST1 and ST2.

In this manner, in the first initial period Ts, the upper dummy stage ST0 is reset.

Thereafter, in a second initial period T0, the first clock pulse CLK1 is supplied to the drain terminal of the pull-up switching device Trpu in the lower dummy stage STn+1. At this time, because the set node Q of the lower dummy stage STn+1 is kept floating in the second initial period T0, a voltage maintained at the set node Q is bootstrapped by the first clock pulse CLK1 supplied to the pull-up switching device Trpu. The pull-up switching device Trpu outputs the first clock pulse CLK1 as the second dummy scan pulse Voutn+1.

The second dummy scan pulse Voutn+1 is supplied to the nth and (n−1)th stages STn and STn−1, so as to set the nth and (n−1)th stages STn and STn−1.

In other words, the second dummy scan pulse Voutn+1 outputted from the lower dummy stage STn+1 is supplied to each of the gate terminals of the fourth and eighth switching devices Tr4 and Tr8 in the nth stage STn.

As a result, the fourth and eighth switching devices Tr4 and Tr8 are turned on and the reverse voltage V_R of the high state is applied to the set node Q through the turned-on fourth switching device Tr4. Accordingly, the set node Q is charged and the pull-up switching device Trpu and the seventh and tenth switching devices Tr7 and Tr10, connected to the charged set node Q through the gate terminals thereof, are thus turned on.

The forward voltage V F and discharging voltage VSS of the low state are supplied to the first reset node QB1, respectively, through the turned-on eighth and tenth switching devices Tr8 and Tr10, thereby causing the first reset node QB1 to be discharged. As a result, the first pull-down switching device Trpd1 and the second switching device Tr2, connected to the first reset node QB1 through the gate terminals thereof, are turned off.

On the other hand, because the first AC voltage Vac1 is maintained in the high state for the first frame period, the fifth and ninth switching devices Tr5 and Tr9 supplied with the first AC voltage Vac1 are kept turned on for the first frame period. The first AC voltage Vac1 is supplied to the first reset node QB1 of the nth stage STn through the turned-on fifth switching device Tr5. At this time, the forward voltage V_F of the low state outputted through the turned-on eighth switching device Tr8 is also supplied to the first reset node QB1. That is, the first AC voltage Vac1 of the high state and the forward voltage V_F of the low state are together supplied to the first reset node QB1.

Notably, because the size of each of the eighth and tenth switching devices Tr8 and Tr10 supplying the forward voltage V_F and discharging voltage VSS is set to be larger than that of the fifth switching device Tr5 supplying the first AC voltage Vac1, the discharging voltage VSS is maintained at the first reset node QB1. On the other hand, the discharging voltage VSS outputted through the eleventh and twelfth switching devices Tr11 and Tr12 is further supplied to the first reset node QB1. The eleventh and twelfth switching devices Tr11 and Tr12 of the nth stage STn, which are connected to the set node Q of the lower dummy stage STn+1, are kept turned on because the set node Q is kept charged in this period. As a result, the first reset node QB1 is discharged and the second switching device Tr2 and the first pull-down switching device Trpd1, connected to the discharged first reset node QB1 through the gate terminals thereof, are thus turned off.

On the other hand, the second reset node QB2 is discharged by the discharging voltage VSS supplied through the turned-on seventh, ninth and twelfth switching devices Tr7, Tr9 and Tr12. As a result, the third switching device Tr3 and the second pull-down switching device Trpd2, connected to the discharged second reset node QB2 through the gate terminals thereof, are thus turned off.

In this manner, in the second initial period T0, the set node Q of the nth stage STn is charged and the first and second reset nodes QB1 and QB2 of the nth stage STn are discharged. That is, in the second initial period T0, the nth stage STn is set.

On the other hand, in this second initial period T0, the (n−1)th stage STn−1 is also set in response to the second dummy scan pulse Voutn+1 in a similar manner to the nth stage STn. Namely, although not shown in the drawings, the second dummy scan pulse Voutn+1 is supplied to the gate terminal of the fourth switching device Tr4 of the (n−1)th stage STn−1.

Accordingly, the set node Q of the (n−1)th stage STn−1 is charged and the first and second reset nodes QB1 and QB2 of the (n−1)th stage STn−1 are reset, because the first reset node QB1 of the (n−1)th stage STn−1 is connected to the second reset node QB2 of the nth stage STn and the second reset node QB2 of the (n−1)th stage STn−1 is connected to the first reset node QB1 of the nth stage STn.

Meanwhile, in the second initial period T0, the fifth and ninth switching devices Tr5 and Tr9 of the (n−1)th stage STn−1 are turned off, because the second AC voltage Vac2 supplied to the gate terminals of the fifth and ninth switching devices Tr5 and Tr9 is in the low state.

Next, a description will be given of an operation in a first period T1.

In the first period T1, only the first and fourth clock pulses CLK1 and CLK4 are maintained in the high state, and the remaining clock pulses CLK2 and CLK3, including the start pulse Vst, are maintained in the low state, as shown in FIG. 3.

The nth and (n−1)th stages STn and STn−1 repeat the above-stated setting operations once more in response to the first clock pulse CLK1.

Also, in the first period TI, as the pull-up switching device Trpu of the nth stage STn is supplied with the fourth clock pulse CLK4, it outputs the fourth clock pulse CLK4 as the nth scan pulse Voutn and supplies it to the nth gate line and (n−2)th stage STn−2. At this time, because the set node Q of the nth stage STn is kept floating in the first period T1, a voltage maintained at the set node Q is bootstrapped by the fourth clock pulse CLK4 supplied to the pull-up switching device Trpu.

Next, a description will be given of an operation in a second period T2.

In the second period T2, only the fourth and third clock pulses CLK4 and CLK3 are maintained in the high state, and the remaining clock pulses CLK1 and CLK2, including the start pulse Vst, are maintained in the low state.

The pull-up switching device Trpu in the nth stage STn outputs the nth scan pulse Voutn in a complete form in response to the fourth clock pulse CLK4. In this second period T2, the (n−2)th stage STn−2 is set by the nth scan pulse Voutn.

Also, the pull-up switching device Trpu in the (n−1)th stage STn−1 begins to output the (n−1)th scan pulse Voutn−1 in response to the third clock pulse CLK3. That is, the pull-up switching device Trpu outputs the third clock pulse CLK3 as the (n−1)th scan pulse Voutn−1 and supplies it to the (n−1)th gate line, (n−3)th stage STn−3 and lower dummy stage STn+1. At this time, because the set node Q of the (n−1)th stage STn−1 is kept floating in the second period T2, a voltage maintained at the set node Q is bootstrapped by the third clock pulse CLK3 supplied to the pull-up switching device Trpu.

Here, the (n−1)th scan pulse from the (n−1)th stage STn−1 resets the lower dummy stage STn+1.

The resetting operation of the lower dummy stage STn+1 will hereinafter be described in detail.

The (n−1)th scan pulse Voutn−1 is supplied to the gate terminals of the first, sixth and twelfth switching devices Tr1, Tr6 and Tr12 in the lower dummy stage STn+1. As a result, the first switching device Tr1 is turned on and the forward voltage V_F of the low state is supplied to the set node Q through the turned-on first switching device Tr1. Consequently, the set node Q is discharged and the pull-up switching device Trpu and third switching device Tr3 of the lower dummy stage STn+1, connected to the discharged set node Q through the gate terminals thereof, are thus turned off. Because the set node Q of the lower dummy stage STn+1 is also connected to the gate terminals of the eleventh and twelfth switching devices Tr11 and Tr12 of the nth stage STn, the eleventh and twelfth switching devices Tr11 and Tr12 of the nth stage STn are also turned off.

Also, as the sixth switching device Tr6 is turned on, the reverse voltage V_R of the high state is supplied to the first reset node QB1, so as to charge the first reset node QB1. The first AC voltage Vac1 of the high state is also supplied to the first reset node QB1 through the turned-on thirteenth switching device Tr13. As a result, the second switching device Tr2 and first pull-down switching device Trpd1, connected to the charged first reset node QB1 through the gate terminals thereof, are turned on. The turned-on first pull-down switching device Trpd1 outputs the discharging voltage VSS.

In this manner, in the second period T2, the set node Q and second reset node QB2 of the lower dummy stage STn+1 are discharged and the first reset node QB1 of the lower dummy stage STn+1 is charged. That is, in this second period T2, the lower dummy stage STn+1 is reset.

On the other hand, in a third period T3, the (n−2)th scan pulse Voutn−2 from the (n−2)th stage STn−2 is supplied to the (n−2)th gate line, (n−4)th stage STn−4 and nth stage STn. At this time, the nth stage STn is reset by the (n−2)th scan pulse Voutn−2.

The resetting operation of the nth stage STn will hereinafter be described in detail.

The (n−2)th scan pulse Voutn−2 from the (n−2)th stage STn−2 is supplied to the gate terminal of the first switching device Tr1 in the nth stage STn.

As a result, the first switching device Tr1 is turned on and the forward voltage V_F of the low state is supplied to the set node Q through the turned-on first switching device Tr1. Consequently, the set node Q is discharged and the pull-up switching device Trpu and the seventh and tenth switching devices Tr7 and Tr10, connected to the discharged set node Q through the gate terminals thereof, are thus turned off.

Thereafter, in the third period T3, the (n−3)th scan pulse from the (n−3)th stage is supplied to the gate terminal of the sixth switching device Tr6 of the nth stage STn, so that the first pull-down switching device Trpd1 of the nth stage STn outputs the discharging voltage VSS.

On the other hand, the node controller included in each stage of the present invention may have the following circuit configuration.

Figure 7:
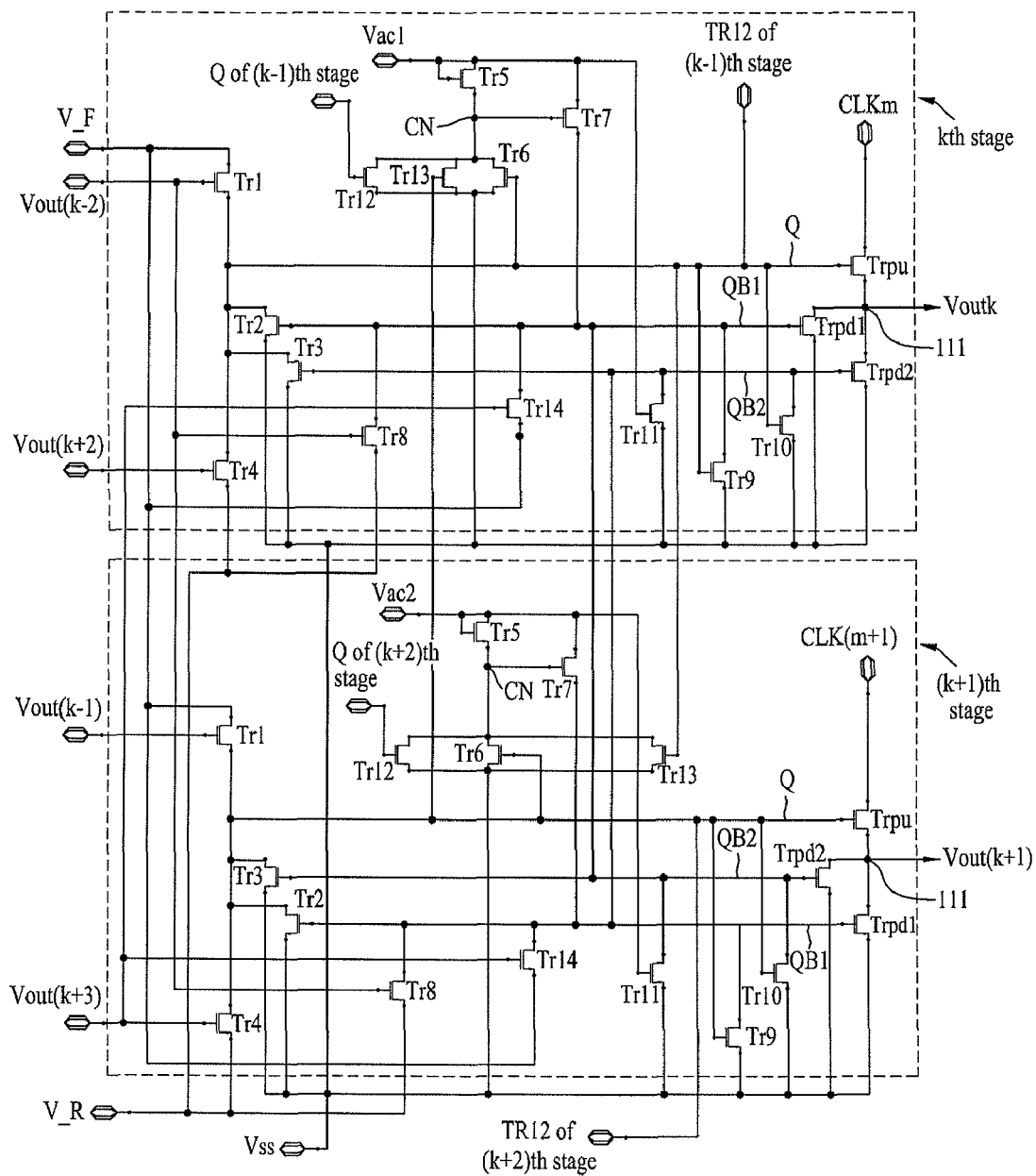
FIG. 7 is a circuit diagram showing another circuit configuration of a node controller included in each stage of the present invention.

FIG. 7 is a circuit diagram showing another circuit configuration of the node controller included in each stage of the present invention.

The node controller of a kth stage may have a configuration as follows.

A first switching device Tr1 is turned on/off in response to a scan pulse from a (k−2)th stage, and when turned on, interconnects the forward voltage line transferring the forward voltage V_F and the set node Q of the kth stage.

A second switching device Tr2 is turned on/off according to the voltage level of the first reset node QB1 of the kth stage, and when turned on, interconnects the set node Q of the kth stage and the discharging voltage line transferring the discharging voltage VSS.

A third switching device Tr3 is turned on/off according to the voltage level of the second reset node QB2 of the kth stage, and when turned on, interconnects the set node Q of the kth stage and the discharging voltage line.

A fourth switching device Tr4 is turned on/off in response to a scan pulse from a (k+2)th stage, and when turned on, interconnects the set node Q of the kth stage and the reverse voltage line transferring the reverse voltage V_R.

A fifth switching device Tr5 is turned on/off according to any one of the first and second AC voltages Vac1 and Vac2, and when turned on, interconnects any one of the first AC voltage line transferring the first AC voltage Vac1 and the second AC voltage line transferring the second AC voltage Vac2 and a common node CN of the kth.

A sixth switching device Tr6 is turned on/off according to the voltage level of the set node Q of the kth stage, and when turned on, interconnects the common node CN of the kth stage and the discharging voltage line.

A seventh switching device Tr7 is turned on/off according to the voltage level of the common node CN of the kth stage, and when turned on, interconnects any one of the first and second AC voltage lines and the first reset node QB1 of the kth stage.

An eighth switching device Tr8 is turned on/off in response to any one of the scan pulse from the (k−2)th stage and a scan pulse from a (k−3)th stage, and when turned on, interconnects the first reset node QB1 of the kth stage and the reverse voltage line.

A ninth switching device Tr9 is turned on/off according to the voltage level of the set node Q of the kth stage, and when turned on, interconnects the first reset node QB1 of the kth stage and the discharging voltage line.

A tenth switching device Tr10 is turned on/off according to the voltage level of the set node Q of the kth stage, and when turned on, interconnects the second reset node QB2 of the kth stage and the discharging voltage line.

An eleventh switching device Tr11 is turned on/off according to any one of the first and second AC voltages Vac1 and Vac2, and when turned on, interconnects the second reset node QB2 of the kth stage and the discharging voltage line.

A twelfth switching device Tr12 is turned on/off according to the voltage level of any one of the set nodes Q of (k−1)th and (k+1)th stages, and when turned on, interconnects the common node CN of the kth stage and the discharging voltage line.

A thirteenth switching device Tr13 is turned on/off according to the voltage level of any one of the set nodes Q of the (k+1)th and (k−1)th stages, and when turned on, interconnects the common node CN of the kth stage and the discharging voltage line.

A fourteenth switching device Tr14 is turned on/off in response to any one of the scan pulse from the (k+2)th stage and a scan pulse from a (k+3)th stage, and when turned on, interconnects the first reset node QB1 of the kth stage and the forward voltage line.

Here, the fifth, seventh and eleventh switching devices Tr5, Tr7 and Tr11 of a (2k−1)th stage are supplied with the first AC voltage Vac1; the fifth, seventh and eleventh switching devices Tr5, Tr7 and Tr11 of a (2k)th stage are supplied with the second AC voltage Vac2; and the eighth switching device Tr8 of each of the (2k−1)th and (2k)th stages are supplied with a scan pulse from a (2k−3)th stage. Also, the twelfth switching device Tr12 of the (2k−1)th stage is turned on/off according to the voltage level of the set node Q of a (2k−2)th stage, and when turned on, interconnects the common node CN of the (2k−1)th stage and the discharging voltage line. The twelfth switching device Tr12 of the (2k)th stage is turned on/off according to the voltage level of the set node Q of a (2k+1)th stage, and when turned on, interconnects the common node CN of the (2k)th stage and the discharging voltage line. The thirteenth switching device Tr13 of the (2k−1)th stage is turned on/off according to the voltage level of the set node Q of the (2k)th stage, and when turned on, interconnects the common node CN of the (2k−1)th stage and the discharging voltage line. The thirteenth switching device Tr13 of the (2k)th stage is turned on/off according to the voltage level of the set node Q of the (2k−1)th stage, and when turned on, interconnects the common node CN of the (2k)th stage and the discharging voltage line. The fourteenth switching device Tr14 of each of the (2k−1)th and (2k)th stages is supplied with a scan pulse from a (2k+2)th stage.

On the other hand, although not shown in the drawings, the scan pulse from the kth stage may set both the (k+1)th and (k+2)th stages. That is, the scan pulse from the kth stage may be supplied to the gate terminal of the first switching device Tr1 of each of the (k+1)th and (k+2)th stages.

As apparent from the above description, a shift register according to the present invention has effects as follows.

The shift register of the present invention can change the output order of stages through a scan direction controller. Therefore, the shift register of the present invention is applicable to display devices of various models.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A shift register comprising a plurality of stages for sequentially outputting scan pulses to drive a plurality of gate lines, wherein each of the stages comprises:
   a set node;
   a pull-up switching device that outputs a scan pulse according to a logic state of the set node;
   at least two reset nodes;
   at least two pull-down switching devices, each of the pull-down switching devices being connected to a corresponding reset node to output an off voltage according to a voltage level of the corresponding reset node; and
   a node controller that controls logic states of the nodes of a corresponding stage along with logic states of the nodes of stages different from the corresponding stage,
   wherein the node controllers of the stages control an output order of the scan pulses from the stages according to a forward voltage and reverse voltage having opposite phases;
   wherein each of the stages comprises a first reset node, a first pull-down switching device connected to the first reset node, a second reset node, and a second pull-down switching device connected to the second reset node;
   wherein each of the stages is further supplied with:
   one of a plurality of clock pulses having different phases, a discharging voltage, and
   one of first and second alternating current (AC) voltages having opposite phases;
   wherein the first reset node of a (2k−1)th stage and the second reset node of a (2k)th stage are directly connected to each other, and the second reset node of the (2k−1)th stage and the first reset node of the (2k)th stage are directly connected to each other; and
   wherein the set node of a (2k−2)th stage is connected to a gate terminal of a switching device of the (2k−1)th stage, and the set node of the (2k−1)th stage is connected to a gate terminal of a switching device of the (2k−2)th stage.

2. The shift register according to claim 1, wherein the node controller of a kth stage comprises:
   a first switching device turned on/off in response to a scan pulse from a (k−2)th one of the stages, the first switching device, when turned on, interconnecting a forward voltage line transferring the forward voltage and the set node of the kth stage;
   a second switching device turned on/off according to a voltage level of the first reset node of the kth stage, the second switching device, when turned on, interconnecting the set node of the kth stage and a discharging voltage line transferring the discharging voltage;
   a third switching device turned on/off according to a voltage level of the second reset node of the kth stage, the third switching device, when turned on, interconnecting the set node of the kth stage and the discharging voltage line;
   a fourth switching device turned on/off in response to a scan pulse from a (k+2)th one of the stages, the fourth switching device, when turned on, interconnecting the set node of the kth stage and a reverse voltage line transferring the reverse voltage;
   a fifth switching device turned on/off according to any one of the first and second AC voltages, the fifth switching device, when turned on, interconnecting one of a first AC voltage line transferring the first AC voltage and a second AC voltage line transferring the second AC voltage and the first reset node of the kth stage;
   a sixth switching device turned on/off in response to any one of the scan pulse from the (k−2)th stage and a scan pulse from a (k−3)th stage, the sixth switching device, when turned on, interconnecting the reverse voltage line and the first reset node of the kth stage;
   a seventh switching device turned on/off according to a voltage level of the set node of the kth stage, the seventh switching device, when turned on, interconnecting the second reset node of the kth stage and the discharging voltage line;
   an eighth switching device turned on/off in response to any one of the scan pulse from the (k+2)th stage and a scan pulse from a (k+3)th stage, the eighth switching device, when turned on, interconnecting the first reset node of the kth stage and the forward voltage line;
   a ninth switching device turned on/off according to one of the first and second AC voltages, the ninth switching device, when turned on, interconnecting the second reset node of the kth stage and the discharging voltage line a tenth switching device turned on/off according to the voltage level of the set node of the kth stage, the tenth switching device, when turned on, interconnecting the first reset node of the kth stage and the discharging voltage line;
   an eleventh switching device turned on/off according to a voltage level of one of the set nodes of (k−1)th and (k+1)th stages, the eleventh switching device, when turned on, interconnecting one of the first and second reset nodes of the kth stage and the discharging voltage line; and
   a twelfth switching device turned on/off according to the voltage level of one of the set nodes of the (k−1)th and (k+1)th stages, the twelfth switching device, when turned on, interconnecting any one of the first and second reset nodes of the kth stage and the discharging voltage line, wherein the fifth switching device of the (2k−1)th stage is supplied with the first AC voltage, wherein the fifth switching device of the (2k)th stage is supplied with the second AC voltage, wherein the sixth switching device of each of the (2k−1)th and (2k)th stages is supplied with a scan pulse from a (2k−3)th stage, wherein the eighth switching device of each of the (2k−1)th and (2k)th stages is supplied with a scan pulse from a (2k+2)th stage, wherein the ninth switching device of the (2k−1)th stage is supplied with the first AC voltage, wherein the ninth switching device of the (2k)th stage is supplied with the second AC voltage, wherein the eleventh switching device of the (2k−1)th stage is turned on/off according to a voltage level of the set node of the (2k−2)th stage, and when turned on, interconnects the first reset node of the (2k−1)th stage and the discharging voltage line, wherein the eleventh switching device of the (2k)th stage is turned on/off according to a voltage level of the set node of a (2k+1)th one of the stages, and when turned on, interconnects the second reset node of the (2k)th stage and the discharging voltage line, wherein the twelfth switching device of the (2k−1)th stage is turned on/off according to the voltage level of the set node of the (2k−2)th stage, and when turned on, interconnects the second reset node of the (2k−1)th stage and the discharging voltage line, wherein the twelfth switching device of the (2k)th stage is turned on/off according to the voltage level of the set node of the (2k+1)th stage, and when turned on, interconnects the first reset node of the (2k)th stage and the discharging voltage line.

3. The shift register according to claim 1, wherein the node controller of a kth stage comprises:

a first switching device turned on/off in response to a scan pulse from a (k−2)th one of the stages, the first switching device, when turned on, interconnecting a forward voltage line transferring the forward voltage and the set node of the kth stage;

a second switching device turned on/off according to a voltage level of the first reset node of the kth stage, the second switching device, when turned on, interconnecting the set node of the kth stage and a discharging voltage line transferring the discharging voltage;

a third switching device turned on/off according to a voltage level of the second reset node of the kth stage, the third switching device, when turned on, interconnecting the set node of the kth stage and the discharging voltage line;

a fourth switching device turned on/off in response to a scan pulse from a (k+2)th one of the stages, the fourth switching device, when turned on, interconnecting the set node of the kth stage and a reverse voltage line transferring the reverse voltage;

a fifth switching device turned on/off according to any one of the first and second AC voltages, the fifth switching device, when turned on, interconnecting any one of a first AC voltage line transferring the first AC voltage and a second AC voltage line transferring the second AC voltage and a common node of the kth stage;

a sixth switching device turned on/off according to a voltage level of the set node of the kth stage, the sixth switching device, when turned on, interconnecting the common node of the kth stage and the discharging voltage line a seventh switching device turned on/off according to a voltage level of the common node of the kth stage, the seventh switching device, when turned on, interconnecting any one of the first and second AC voltage lines and the first reset node of the kth stage;

an eighth switching device turned on/off in response to any one of the scan pulse from the (k−2)th stage and a scan pulse from a (k−3)th one of the stages, the eighth switching device, when turned on, interconnecting the first reset node of the kth stage and the reverse voltage line;

a ninth switching device turned on/off according to the voltage level of the set node of the kth stage, the ninth switching device, when turned on, interconnecting the first reset node of the kth stage and the discharging voltage line;

a tenth switching device turned on/off according to the voltage level of the set node of the kth stage, the tenth switching device, when turned on, interconnecting the second reset node of the kth stage and the discharging voltage line;

an eleventh switching device turned on/off according to any one of the first and second AC voltages, the eleventh switching device, when turned on, interconnecting the second reset node of the kth stage and the discharging voltage line;

a twelfth switching device turned on/off according to a voltage level of any one of the set nodes of (k−1)th and (k+1)th ones of the stages, the twelfth switching device, when turned on, interconnecting the common node of the kth stage and the discharging voltage line a thirteenth switching device turned on/off according to the voltage level of any one of the set nodes of the (k+1)th and (k−1)th stages, the thirteenth switching device, when turned on, interconnecting the common node of the kth stage and the discharging voltage line; and a fourteenth switching device turned on/off in response to any one of the scan pulse from the (k+2)th stage and a scan pulse from a (k+3)th one of the stages, the fourteenth switching device, when turned on, interconnecting the first reset node of the kth stage and the forward voltage line, wherein the fifth, seventh and eleventh switching devices of the (2k−1)th stage are supplied with the first AC voltage, wherein the fifth, seventh and eleventh switching devices of the (2k)th stage are supplied with the second AC voltage, wherein the eighth switching device of each of the (2k−1)th and (2k)th stages is supplied with a scan pulse from a (2k−3)th stage, wherein the twelfth switching device of the (2k−1)th stage is turned on/off according to a voltage level of the set node of the (2k−2)th stage, and when turned on, interconnects a common node of the (2k−1)th stage and the discharging voltage line, wherein the twelfth switching device of the (2k)th stage is turned on/off according to a voltage level of the set node of a (2k+1)th one of the stages, and when turned on, interconnects a common node of the (2k)th stage and the discharging voltage line, wherein the thirteenth switching device of the (2k−1)th stage is turned on/off according to a voltage level of the set node of the (2k)th stage, and when turned on, interconnects the common node of the (2k−1)th stage and the discharging voltage line, wherein the thirteenth switching device of the (2k)th stage is turned on/off according to a voltage level of the set node of the (2k−1)th stage, and when turned on, interconnects the common node of the (2k)th stage and the discharging voltage line, wherein the fourteenth switching device of each of the (2k−1)th and (2k)th stages is supplied with a scan pulse from a (2k+2)th stage.

4. The shift register according to claim 1, wherein the stages output the scan pulses in order from a first stage to an mth stage in forward driving, the mth stage being a last stage, and the stages outputting the scan pulses in order from the mth stage to the first stage in reverse driving, wherein the shift register further comprises:
an upper dummy stage that sets or resets the first stage and a second stage; and
a lower dummy stage that sets or resets the mth stage and an (m−1)th stage.

5. The shift register according to claim 4, wherein each of the upper and lower dummy stages comprises a set node, a pull-up switching device that outputs a scan pulse according to a logic state of the set node, a first reset node, a first pull-down switching device connected to the first reset node, a second reset node, a second pull-down switching device connected to the second reset node, and a node controller that controls voltage levels of the nodes, wherein each of the upper and lower dummy stages is further supplied with:
one of a plurality of clock pulses having different phases,
a discharging voltage, and
one of first and second alternating current (AC) voltages having opposite phases,
wherein the set node of the upper dummy stage is connected to a switching device of the first stage,
wherein the set node of the lower dummy stage is connected to a switching device of the mth stage.

6. The shift register according to claim 5, wherein the node controller of the upper dummy stage comprises:
a first switching device turned on/off in response to an external start pulse, the first switching device, when turned on, interconnecting a forward voltage line transferring the forward voltage and the set node of the upper dummy stage;
a second switching device turned on/off according to the voltage level of the first reset node of the upper dummy stage, the second switching device, when turned on, interconnecting the set node of the upper dummy stage and a discharging voltage line transferring the discharging voltage;
a third switching device turned on/off according to the voltage level of the second reset node of the upper dummy stage, the third switching device, when turned on, interconnecting the set node of the upper dummy stage and the discharging voltage line;
a fourth switching device turned on/off in response to a scan pulse from the second stage, the fourth switching device, when turned on, interconnecting the set node of the upper dummy stage and a reverse voltage line transferring the reverse voltage;
a fifth switching device turned on/off according to the first AC voltage, the fifth switching device, when turned on, interconnecting a first AC voltage line transferring the first AC voltage and a first common node of the upper dummy stage;
a sixth switching device turned on/off in response to the start pulse, the sixth switching device, when turned on, interconnecting the reverse voltage line and the first reset node of the upper dummy stage;
a seventh switching device turned on/off according to the voltage level of the set node of the upper dummy stage, the seventh switching device, when turned on, interconnecting the second reset node of the upper dummy stage and the discharging voltage line;
an eighth switching device turned on/off in response to the scan pulse from the second stage, the eighth switching device, when turned on, interconnecting the first reset node of the upper dummy stage and the forward voltage line;
a ninth switching device turned on/off according to the first AC voltage, the ninth switching device, when turned on, interconnecting the second reset node of the upper dummy stage and the discharging voltage line
a tenth switching device turned on/off according to the voltage level of the set node of the upper dummy stage, the tenth switching device, when turned on, interconnecting the first reset node of the upper dummy stage and the discharging voltage line;
an eleventh switching device turned on/off in response to the scan pulse from the second stage, the eleventh switching device, when turned on, interconnecting the second reset node of the upper dummy stage and the forward voltage line
a twelfth switching device turned on/off in response to the start pulse, the twelfth switching device, when turned on, interconnecting the reverse voltage line and the second reset node of the upper dummy stage;
a thirteenth switching device turned on/off according to a voltage level of the first common node of the upper dummy stage, the thirteenth switching device, when turned on, interconnecting the first AC voltage line and the first reset node of the upper dummy stage;
a fourteenth switching device turned on/off according to the voltage level of the set node of the upper dummy stage, the fourteenth switching device, when turned on, interconnecting the first common node of the upper dummy stage and the discharging voltage line;
a fifteenth switching device turned on/off according to the second AC voltage, the fifteenth switching device, when turned on, interconnecting a second AC voltage line transferring the second AC voltage and a second common node of the upper dummy stage;
a sixteenth switching device turned on/off according to the second AC voltage, the sixteenth switching device, when turned on, interconnecting the first reset node of the upper dummy stage and the discharging voltage line;
a seventeenth switching device turned on/off according to a voltage level of the second common node of the upper dummy stage, the seventeenth switching device, when turned on, interconnecting the second AC voltage line and the second reset node of the upper dummy stage; and
an eighteenth switching device turned on/off according to the voltage level of the set node of the upper dummy stage, the eighteenth switching device, when turned on, interconnecting the second common node of the upper dummy stage and the discharging voltage line,
wherein the set node of the upper dummy stage is connected to a switching device of the first stage.

7. The shift register according to claim 5, wherein the node controller of the lower dummy stage comprises:
a first switching device turned on/off in response to a scan pulse from the (m−1)th stage, the first switching device, when turned on, interconnecting a forward voltage line transferring the forward voltage and the set node of the lower dummy stage;

a second switching device turned on/off according to the voltage level of the first reset node of the lower dummy stage, the second switching device, when turned on, interconnecting the set node of the lower dummy stage and a discharging voltage line transferring the discharging voltage;

a third switching device turned on/off according to the voltage level of the second reset node of the upper dummy stage, the third switching device, when turned on, interconnecting the set node of the lower dummy stage and the discharging voltage line;

a fourth switching device turned on/off in response to an external start pulse, the fourth switching device, when turned on, interconnecting the set node of the lower dummy stage and a reverse voltage line transferring the reverse voltage;

a fifth switching device turned on/off according to the first AC voltage, the fifth switching device, when turned on, interconnecting a first AC voltage line transferring the first AC voltage and a first common node of the lower dummy stage;

a sixth switching device turned on/off in response to the scan pulse from the (m−1)th stage, the sixth switching device, when turned on, interconnecting the reverse voltage line and the first reset node of the lower dummy stage;

a seventh switching device turned on/off according to the voltage level of the set node of the lower dummy stage, the seventh switching device, when turned on, interconnecting the second reset node of the lower dummy stage and the discharging voltage line;

an eighth switching device turned on/off in response to the start pulse, the eighth switching device, when turned on, interconnecting the first reset node of the lower dummy stage and the forward voltage line;

a ninth switching device turned on/off according to the first AC voltage, the ninth switching device, when turned on, interconnecting the second reset node of the lower dummy stage and the discharging voltage line;

a tenth switching device turned on/off according to the voltage level of the set node of the lower dummy stage, the tenth switching device, when turned on, interconnecting the first reset node of the lower dummy stage and the discharging voltage line;

an eleventh switching device turned on/off in response to the start pulse, the eleventh switching device, when turned on, interconnecting the second reset node of the lower dummy stage and the forward voltage line a twelfth switching device turned on/off in response to the scan pulse from the (m−1)th stage, the twelfth switching device, when turned on, interconnecting the reverse voltage line and the second reset node of the lower dummy stage a thirteenth switching device turned on/off according to a voltage level of the first common node of the lower dummy stage, the thirteenth switching device, when turned on, interconnecting the first AC voltage line and the first reset node of the lower dummy stage;

a fourteenth switching device turned on/off according to the voltage level of the set node of the lower dummy stage, the fourteenth switching device, when turned on, interconnecting the first common node of the lower dummy stage and the discharging voltage line;

a fifteenth switching device turned on/off according to the second AC voltage, the fifteenth switching device, when turned on, interconnecting a second AC voltage line transferring the second AC voltage and a second common node of the lower dummy stage;

a sixteenth switching device turned on/off according to the second AC voltage, the sixteenth switching device, when turned on, interconnecting the first reset node of the lower dummy stage and the discharging voltage line;

a seventeenth switching device turned on/off according to a voltage level of the second common node of the lower dummy stage, the seventeenth switching device, when turned on, interconnecting the second AC voltage line and the second reset node of the lower dummy stage; and an eighteenth switching device turned on/off according to the voltage level of the set node of the lower dummy stage, the eighteenth switching device, when turned on, interconnecting the second common node of the lower dummy stage and the discharging voltage line, wherein the set node of the lower dummy stage is connected to a switching device of the mth stage.

* * * * *